United States Patent
Shimizu

(10) Patent No.: US 10,408,887 B2
(45) Date of Patent: Sep. 10, 2019

(54) METHOD FOR ESTIMATING DEGRADATION OF RECHARGEABLE BATTERY, DEGRADATION ESTIMATION CIRCUIT, ELECTRONIC APPARATUS AND VEHICLE INCLUDING SAME

(71) Applicant: ROHM CO., LTD., Ukyo-Ku, Kyoto (JP)

(72) Inventor: Takahiro Shimizu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 266 days.

(21) Appl. No.: 15/379,982

(22) Filed: Dec. 15, 2016

(65) Prior Publication Data

US 2017/0176544 A1 Jun. 22, 2017

(30) Foreign Application Priority Data

Dec. 17, 2015 (JP) .................................. 2015-246613
Jul. 1, 2016 (JP) .................................. 2016-131798

(51) Int. Cl.
  *G01R 31/392* (2019.01)
  *G01R 31/374* (2019.01)
  *G01R 31/3828* (2019.01)

(52) U.S. Cl.
  CPC ......... *G01R 31/392* (2019.01); *G01R 31/374* (2019.01); *G01R 31/3828* (2019.01)

(58) Field of Classification Search
  CPC .............. G01R 31/361; G01R 31/3679; G01R 31/3675
  See application file for complete search history.

(56) References Cited

U.S. PATENT DOCUMENTS

| | | | |
|---|---|---|---|
| 6,011,379 A * | 1/2000 | Singh | B60L 11/1881 320/132 |
| 9,035,616 B2 | 5/2015 | Wortham | |
| 2010/0030498 A1 * | 2/2010 | Kimura | G01R 31/3679 702/63 |

* cited by examiner

*Primary Examiner* — Mischita L Henson
(74) *Attorney, Agent, or Firm* — Cantor Colburn LLP

(57) ABSTRACT

A method for estimating degradation of a rechargeable battery, includes determining a coulomb count value by integrating a charging/discharging current of the battery, monitoring a state of the battery, detecting that the battery is charged/discharged with a predetermined amount of charges, based on the coulomb count value, and changing an index X indicating degradation of the battery by a variation ΔX in accordance with the state of the battery, which is measured in a period during which the battery is charged/discharged with the predetermined amount of charges, if the charging/discharging of the battery with the predetermined amount of charges is detected.

29 Claims, 20 Drawing Sheets

506

300

400

METHOD FOR ESTIMATING DEGRADATION OF RECHARGEABLE BATTERY, DEGRADATION ESTIMATION CIRCUIT, ELECTRONIC APPARATUS AND VEHICLE INCLUDING SAME

CROSS-REFERENCE TO RELATED APPLICATION(S)

This application is based upon and claims the benefit of priority from Japanese Patent Application Nos. 2015-246613, filed on Dec. 17, 2015, and 2016-131798, filed on Jul. 1, 2016, the entire contents of which are incorporated herein by reference.

TECHNICAL FIELD

The present disclosure relates to a battery management system.

BACKGROUND

A variety of battery-driven electronic apparatuses, including a mobile phone, a digital camera, a tablet terminal, a portable music player, a portable game machine, a notebook computer, etc., contains a rechargeable battery (secondary battery) which supplies power required to operate a CPU (Central Processing Unit) for system control and signal processing, a liquid crystal panel, a radio communication module and other electronic circuits such as analog and digital circuits.

FIG. 1 is a block diagram of a battery-driven electronic apparatus. An electronic apparatus 900 includes a battery 902 and a charging circuit 904 which charges the battery 902. The charging circuit 904 charges the battery 902 with a power supply voltage $V_{ADP}$ received from an external power adaptor and a USB (Universal Serial Bus).

A load 908 is connected to the battery 902. A current $I_{BAT}$ flowing into the battery 902 corresponds to a difference between a charging current $I_{CHG}$ from the charging circuit 904 and a load current (discharging current) $I_{LOAD}$ flowing into the load 908.

It is known that the battery 902 is degraded every time it is repeatedly charged/discharged. Specifically, the degradation of the battery 902 appears as a reduction of its capacity. The electronic apparatus 900 has a degradation estimation function to estimate the degradation of the battery 902. In some cases, a degradation estimation circuit 920 to estimate the degradation of the battery is integrated with a residual capacity detection circuit 906 to detect the residual capacity (state of charging; SOC) of the battery.

The residual capacity detection circuit 906 is called a fuel gauge IC (Integrated Circuit). A voltage method and a coulomb count method (charge integration method) are mainstream methods of detecting the battery residual capacity by means of the residual capacity circuit 906. In some cases, the residual capacity detection circuit 906 is incorporated in the charging circuit 904.

The voltage method is to measure an open circuit voltage (OCV) of the battery in an open state (no-load state) and estimate the residual capacity of the battery from the correspondence relationship between OCV and SOC. Since the OCV cannot be measured when the battery is not in a no-load relaxed state, the OCV cannot be correctly measured during the charging/discharging of the battery.

The coulomb count method is to integrate a charging current flowing into the battery and a discharging current flowing out of the battery (hereinafter these currents are collectively referred to as a charging/discharging current) and estimate the residual capacity of the battery by calculating the quantity of charges of charging and discharging of the battery, The coulomb count method can estimate the battery residual capacity even in a battery use period for which an open voltage cannot be obtained, unlike the voltage method.

The residual capacity detection circuit 906 shown in FIG. 1 estimates the residual capacity of the battery 902 according to the coulomb count method. The residual capacity detection circuit 906 includes a coulomb counter circuit 910 and an SOC calculation part 912. The coulomb counter circuit 910 detects and integrates the current $I_{BAT}$ of the battery 902. A coulomb count value (hereinafter referred to as an accumulated coulomb count (ACC)) determined by the coulomb counter circuit 910 is expressed by the following equation.

$$ACC = \int I_{BAT} dt$$

Speaking strictly, the battery current $I_{BAT}$ is discretely sampled on a time basis and is calculated according to the following equation.

$$ACC = \Sigma(\Delta t \times I_{BAT})$$

Where, $\Delta t$ represents a sampling period.

This integration is performed with a current $I_{BAT}$ flowing out of the battery 902 as positive and a current $I_{BAT}$ flowing into the battery 902 as negative.

The SOC calculation part 912 calculates SOC of the battery 902 based on the calculated ACC. The SOC is calculated according to the following equation.

$$SOC[\%] = (CC_{FULL} - ACC)/CC_{FULL} \times 100$$

Where, $CC_{FULL}$ represents the quantity of charges (coulomb count capacity) accumulated in the battery 902 in a full-charged state and corresponds to the capacity of the battery 902.

A charging/discharging cycle detection part 922 of the degradation estimation circuit 920 detects use corresponding to one charging/discharging cycle based on data determined by the coulomb counter circuit 910. A degradation calculation part 924 increments a charging/discharging cycle number $CYC_{CD}$ every time the charging/discharging cycle detection part 922 detects one charging/discharging cycle. The charging/discharging cycle number $CYC_{CD}$ indicates a degree of degradation of the battery. The charging/discharging cycle number $CYC_{CD}$ can be used as an alarm to indicate the battery life.

In addition, the charging/discharging cycle detection part 922 corrects the coulomb count capacity (battery capacity) $CC_{FULL}$ used in the SOC calculation part 912 based on the charging/discharging cycle number $CYC_{CD}$.

The present inventor has made studies on the degradation estimation circuit 920 of FIG. 1 and came to recognize the following problems. FIG. 2 is a graphical view showing a relationship between the charging/discharging cycle number $CYC_{CD}$ and the degree of degradation of the battery. The degradation degree represents a degraded battery capacity $CC_{FULL}$ with the rated capacity as 100%. As shown in FIG. 2, the relationship between the charging/discharging cycle number $CYC_{CD}$ and the degradation degree is varied depending on conditions such as battery temperature and the like. For example, the battery is degraded faster at a temperature of 45 degrees C. than at a temperature of 25 degrees C. On the other hand, the degradation calculation part 924 defines the relationship between the charging/discharging cycle number $CYC_{CD}$ and the degradation degree (degradation characteristics) under predetermined conditions (such as a predetermined temperature). Therefore, when the predetermined conditions differ from the actual battery use conditions, an error of degradation estimation increases.

SUMMARY

The present disclosure provides some embodiments of a method and circuit which is capable of estimating degradation of a battery with high accuracy.

According to one embodiment of the present disclosure, there is provided a method for estimating degradation of a rechargeable battery, including: determining a coulomb count value by integrating a charging/discharging current of the battery; monitoring a state of the battery; detecting that the battery is charged/discharged with a predetermined amount of charges, based on the coulomb count value; and changing an index X indicating degradation of the battery by a variation $\Delta X$ in accordance with the state of the battery, which is measured in a period during which the battery is charged/discharged with the predetermined amount of charges, if the charging/discharging of the battery with the predetermined amount of charges is detected.

With this configuration, depending on the status of use of the battery, it is possible to adjust a speed of cycle degradation and improve the accuracy of estimation of degradation. In the specification, the phrase "battery is charged/discharged with a predetermined amount of charges" includes (i) "battery is charged with a predetermined amount of charges," (ii) "battery is discharged with a predetermined amount of charges," (iii) "battery is charged and discharged with a predetermined amount of charges," and (iv) "battery is charged or discharged with a predetermined amount of charges."

The state of the battery may include a temperature of the battery. By considering a temperature, it is possible to increase the accuracy of estimation of degradation. The variation $\Delta X$ may be defined in accordance with one temperature T of an average temperature, a maximum temperature, and a minimum temperature in the period during which the battery is charged/discharged with the predetermined amount of charges. By considering the temperature T selected from a group consisting of an average temperature, a maximum temperature, and a minimum temperature, it is possible to increase the accuracy while limiting an increase in computational load.

The variation $\Delta X$ may be defined in accordance with the following equation (1) under a condition in which the temperature T>Tr: $\Delta X = K \times M^{(T-Tr)/\Delta T}$ ... (1), where, K, M, Tr, and $\Delta T$ are parameters. It may be set as 20 degrees C. $\leq Tr \leq 30$ degrees C., $1 < M < 3$ and 5 degrees C. $\leq \Delta T \leq 20$ degrees C. The variation $\Delta X$ is defined based on Arrhenius's law (also referred to as "10 degrees C. double speed" or "temperature double speed"). $\Delta X$ may be K in a range of T<Tr. That is, $\Delta X$ may not depend on a temperature. Alternatively, $\Delta X$ may be in accordance with the equation (1) or a different equation.

In one embodiment, the state of the battery may include a state of charge (SOC) of the battery and the variation $\Delta X$ may depend on the SOC. By considering the SOC, it is possible to improve the accuracy of estimation of degradation. The parameter K may depend on the SOC.

In one embodiment, the method may further include: measuring a time t required for the charging/discharging of the battery with the predetermined amount of charge. The variation $\Delta X$ may depend on the time t.

The charging/discharging of the battery with the predetermined amount of charges may correspond to one charging/discharging cycle and the index X may indicate a charging/discharging cycle number. The index X may indicate a battery capacity.

According to another embodiment of the present disclosure, there is provided a degradation estimation circuit of a rechargeable battery, including: a cycle detection part configured to detect that the battery is charged/discharged with a predetermined amount of charges, based on a coulomb count value determined by integrating a charging/discharging current of the battery; a state monitoring circuit configured to monitor a state of the battery; and a degradation calculation part configured to change an index X indicating degradation of the battery by a variation $\Delta X$ in accordance with the state of the battery, which is measured in a period during which the battery is charged/discharged with the predetermined amount of charges, if the charging/discharging of the battery with the predetermined amount of charges is detected.

According to another embodiment of the present disclosure, there is provided a degradation estimation circuit of a rechargeable battery, including: a correction coulomb counter circuit configured to determine a correction coulomb count value; a cycle detection part configured to detect that the battery is charged/discharged with a predetermined amount of charges, based on the correction coulomb count value; and a degradation calculation part configured to change an index X indicating degradation of the battery by a predetermined value if the battery is charged/discharged with the predetermined amount of charges. The correction coulomb counter circuit is configured to correct a variation of the correction coulomb count value based on at least one selected from a group consisting of a temperature T, a state of charge (SOC), and a cycle time $t_{CYC}$.

According to another embodiment of the present disclosure, there is provided an electronic apparatus including: a rechargeable battery; and the above-described degradation estimation circuit configured to detect the state of the battery.

According to another embodiment of the present disclosure, there is provided a vehicle including: a rechargeable battery; and the above-described degradation estimation circuit configured to detect the state of the battery.

Any combinations of the above-described elements or changes of the representations of the present disclosure between methods, apparatuses and systems are effective as embodiments of the present disclosure.

DETAILED DESCRIPTION

Figure 1:
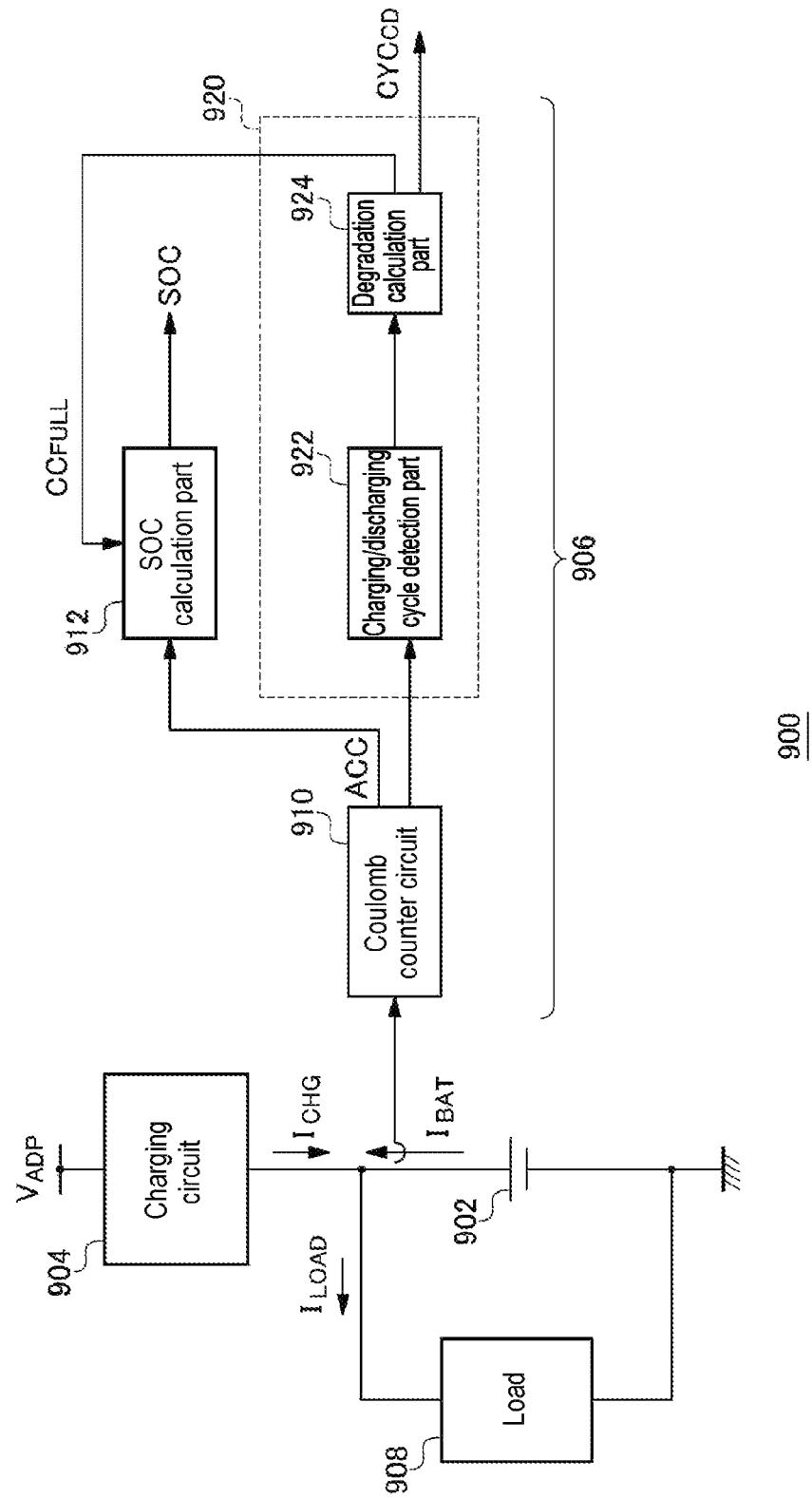
FIG. 1 is a block diagram of a battery-driven electronic apparatus.
Figure 2:
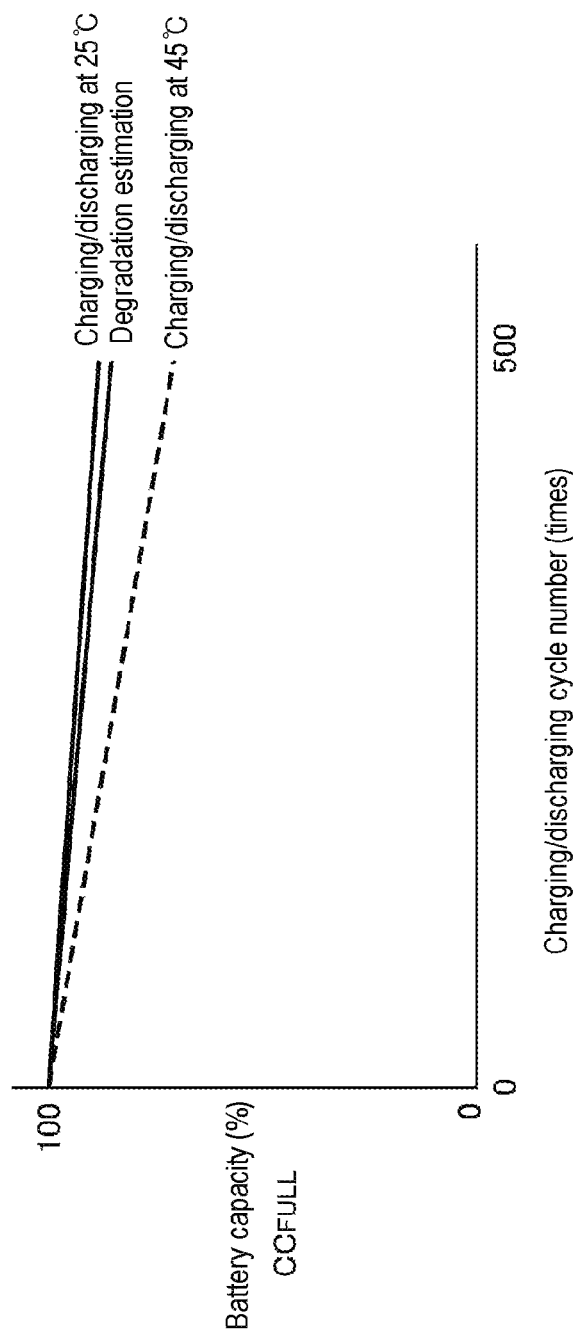
FIG. 2 is a graphical view showing a relationship between a charging/discharging cycle number and a degree of degradation of a battery.

Preferred embodiments of the present invention will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

In the specification, the phrase "connection of a member A and a member B" is intended to include direct physical connection of the member A and the member B as well as indirect connection thereof via other member as long as the other member has no substantial effect on the electrical connection of the member A and the member B. Similarly, the phrase "interposition of a member C between a member A and a member B" is intended to include direct connection of the member A and the member C or direct connection of the member B and the member C as well as indirect connection thereof via the other member as long as the other member has no substantial effect on the electrical connection of the member A, the member B and the member C.

In the specification, a symbol attached to a voltage signal, a current signal or a resistor denotes a voltage value, a current value or a resistance as necessary.

(First Embodiment)

Figure 3:
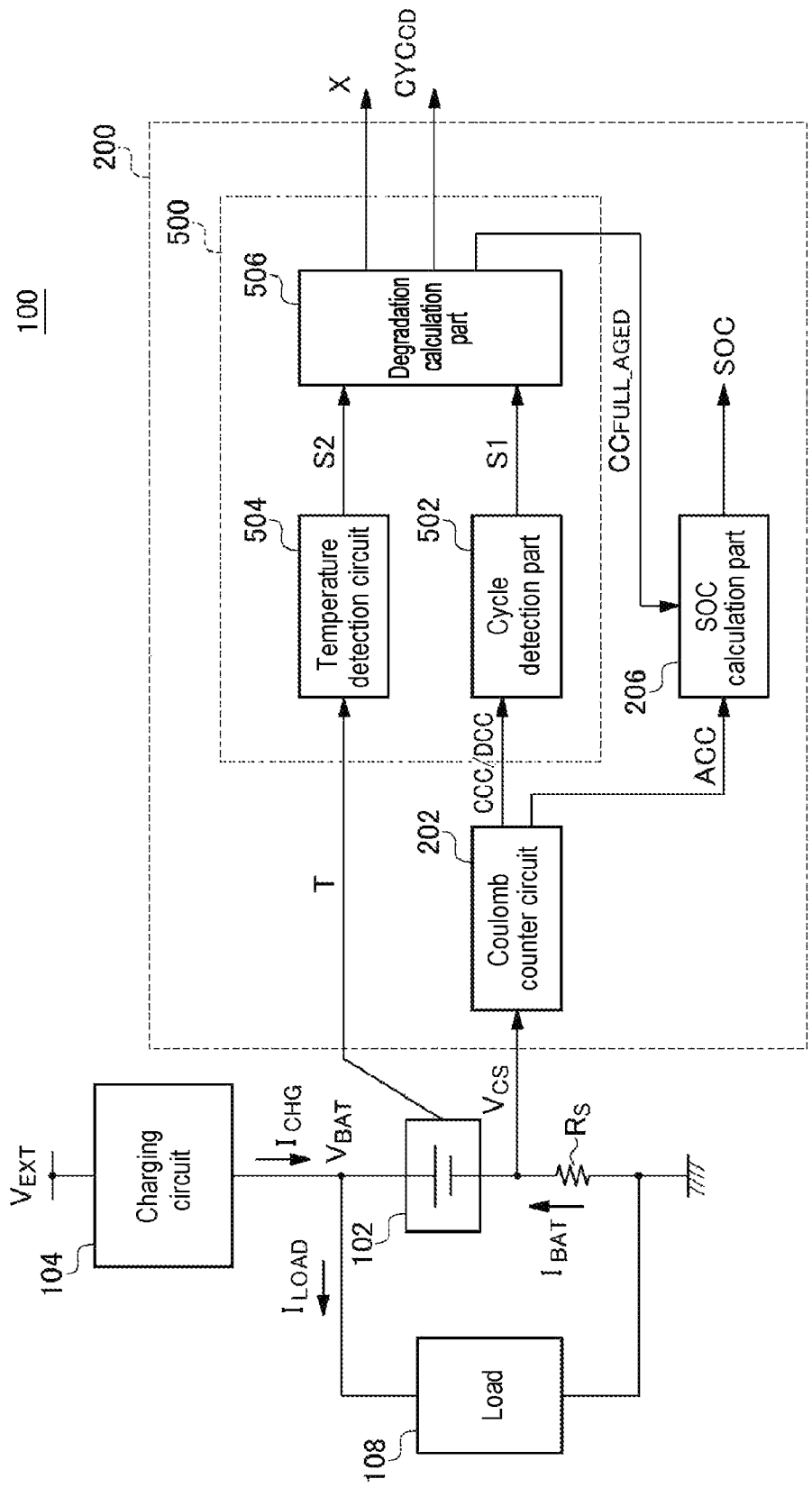
FIG. 3 is a block diagram of a battery management system including a degradation estimation circuit according to a first embodiment.

FIG. 3 is a block diagram of a battery management system 100 including a degradation estimation circuit 500 according to a first embodiment. The battery management system 100 includes a battery 102, a charging circuit 104, a load 108 and a residual capacity detection circuit (fuel gauge IC) 200. The battery 102 includes one or more cells. Examples of cells may include, but are not limited to, a lithium ion cell, a lithium air cell, a lithium metal-based cell, a nickel-hydrogen cell, a nickel-cadmium cell, a nickel-zinc cell and the like. Although depending on applications of the battery management system 100, the number of cells is one to several for portable electronic devices and several tens to several hundred for vehicle batteries, industrial equipment and industrial machines.

A battery voltage $V_{BAT}$ is supplied from the battery 102 to the load 108. The type of the load 108 is not particularly limited. For example, when the battery management system 100 is mounted on an electronic apparatus, the load 108 steps up or down the battery voltage $V_{BAT}$ and may include a power supply circuit which generates a power supply voltage $V_{DD}$ and a variety of electronic circuits which are operated with the power supply voltage $V_{DD}$. When the battery management system 100 is mounted on a vehicle or an industrial machine, the load 108 may include a motor and an inverter which converts the battery voltage $V_{BAT}$ into an AC voltage to drive the motor.

The charging circuit 104 receives a power supply voltage $V_{EXT}$ from an external power supply adaptor, a USB (Universal Serial Bus), a charging station or the like and charges the battery 102 with the power supply voltage $V_{EXT}$.

The residual capacity detection circuit 200 detects a state of charge (SOC) of the battery 102. In the specification, for the purpose of easy understanding, the SOC is described with a percentage of 0% for the minimum value and 100% for the maximum value. However, the present disclosure is not limited thereto. For example, if the SOC is represented with 10 bits, it is noted that the SOC is expressed by 1024 gradations from 0 to 1,023 in a procedure of digital signal processing.

The residual capacity detection circuit 200 includes mainly a coulomb counter circuit 202 and a SOC calculation part 206. The coulomb counter circuit 202 determines an accumulated coulomb count (ACC) value by integrating a charging/discharging current $I_{BAT}$ of the battery 102. The ACC value is expressed by the following equation.

$$ACC = \int I_{BAT} dt$$

The coulomb counter circuit 202 samples the battery current $I_{BAT}$ at a predetermined sampling period $\Delta t$. The ACC value is calculated by the following equation by using a battery current $I_{BAT}[j]$ at each sampling time j.

$$ACC = \Sigma_{j=1}(\Delta t \times I_{BAT}[j])$$

This integration is performed with a current $I_{BAT}$ flowing out of the battery 102 as positive and a current $I_{BAT}$ flowing into the battery 102 as negative.

How to detect the current $I_{BAT}$ is not particularly limited. For example, a voltage drop of a sense resistor $R_S$ connected in series to the battery 102 on a path of the current $I_{BAT}$ may be detected. The sense resistor $R_S$ may be connected to the positive electrode of the battery 102 or the negative electrode thereof. The coulomb counter circuit 202 may include an A/D converter which samples the voltage drop $V_{CS}$ of the sense resistor $R_S$ (or a voltage obtained by amplifying the voltage drop $V_{CS}$), and an integrator which integrates output data of the A/D converter.

The SOC calculation part 206 receives the ACC value from the coulomb counter circuit 202. The SOC calculation part 206 calculates SOC (%) based on the following equation.

$$SOC=(CC_{FULL}-ACC)/CC_{FULL}\times 100$$

Where, $CC_{FULL}$ represents coulomb count capacity corresponding to full-charging.

The battery management system 100 further includes a degradation estimation circuit 500. Although it is illustrated in this embodiment that the degradation estimation circuit 500 is a part of the residual capacity detection circuit 200, the residual capacity detection circuit 200 and the degradation estimation circuit 500 may be separated from each other or may share some hardware.

The degradation estimation circuit 500 includes a cycle detection part 502, a temperature detection circuit 504 and a degradation calculation part 506. The cycle detection part 502 detects that the battery 102 is charged/discharged by a predetermined amount of charges, based on the ACC value determined by the coulomb counter circuit 202. In some embodiments, the predetermined amount of charges refers to an amount of charges corresponding to the capacity $CC_{FULL}$. In addition, in some embodiments, the phrase "charged/discharged by a predetermined amount of charges" is equivalent to the battery being charged and discharged by a predetermined amount of charges, which will be hereinafter referred to as a "charging/discharging cycle."

The charging/discharging cycle will now be described in detail. One charging/discharging cycle is equivalent to an integrated value of a discharging current (i.e., a positive battery current $I_{BAT}$) and an integrated value of a charging current (i.e., a negative battery current $I_{BAT}$) that reaches the coulomb count capacity $CC_{FULL}$ of the battery 102 once. In the following description, a discharge coulomb count value is abbreviated as a DCC value and a charge coulomb count value is abbreviated as a CCC value.

The phase "a variation of a DCC value reaches $CC_{FULL}$" is referred to as a discharging cycle and the phase "a variation of a CCC value reaches $CC_{FULL}$" is referred to as a charging cycle. $CC_{FULL}$ may use a value $CC_{FULL\_AGED}$ indicative of degradation, although it may use a rated value $CC_{FULL\_RATED}$. When the discharging cycle occurs once, the discharging cycle number is incremented by one. Similarly, when the charging cycle occurs once, the charging cycle number is incremented by one. When the charging/discharging cycle occurs once, the charging/discharging cycle number is incremented by one. In other words, one of the discharging cycle number and the charging cycle number is incremented by one. When the charging/discharging cycle, the charging cycle and the discharging cycle are defined in this way, the charging/discharging cycle number becomes equal to a smaller one of the charging cycle number and the discharging cycle number.

The coulomb counter circuit 202 determines a DCC value and a CCC value in addition to the ACC value. The cycle detection part 502 detects a charging/discharging cycle based on the DCC value and the CCC value. The detected charging/discharging cycle is reported to the degradation calculation part 506. For example, every time the cycle detection part 502 detects a one-time charging/discharging cycle (that is, a charging/discharging cycle number is incremented by one), it may assert (e.g., with a high level) its output signal (detection signal) 51 and report the asserted output signal to the degradation calculation part 506. Alternatively, the degradation calculation part 506 may monitor a register storing the charging/discharging cycle number and may substitute a change in value of the register for report of detection of the charging/discharging cycle.

Figure 4:
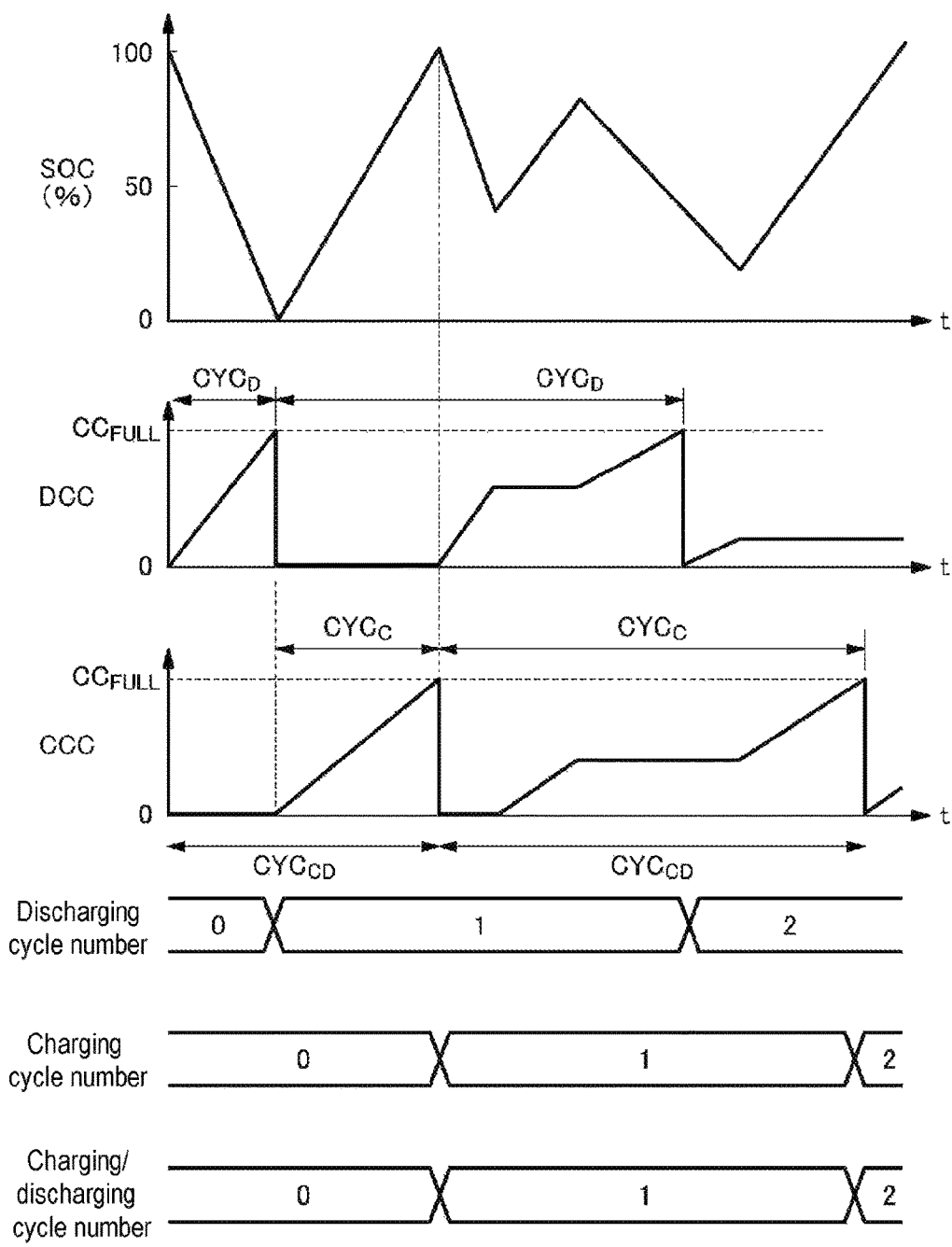
FIG. 4 is a view for describing a charging/discharging cycle.

FIG. 4 is a view for describing the charging/discharging cycle. Here, the DCC value and the CCC value are reset to zero when these values reach $CC_{FULL}$. However, it is not necessary to reset these values. A discharging cycle is denoted by $CYC_D$, a charging cycle is denoted by $CYC_C$, and a charging/discharging cycle is denoted by $CYC_{CD}$.

Returning to FIG. 3, the temperature detection circuit (state monitoring circuit) 504 monitors the temperature T of the battery 102, which is one of the states of the battery 102, and generates temperature information S2 indicating the temperature T. For example, the temperature detection circuit 504 may contain a temperature sensor such as a thermocouple or a thermistor, which is attached to or disposed near the battery 102, and an A/D converter which outputs an output of the temperature sensor into a digital value.

The degradation calculation part 506 determines an index X indicating degradation of the battery 102. Every time charging/discharging of the battery 102 with a predetermined amount of charges is detected (i.e., the charging/discharging cycle $CYC_{CD}$ is detected), the degradation calculation part 506 changes the index X by a variation $\Delta X$ corresponding to the temperature T measured in a period for which the battery 102 is charged/discharged with the predetermined amount of charges. Assuming that a current index is X[i], a temperature measured at an $i^{th}$ charging/discharging cycle $CYC_{CDi}$ is T[i], and a variation corresponding to the measured temperature is $\Delta X[i]$, a new index X[i+1] after detection of the $i^{th}$ charging/discharging cycle $CYC_{CDi}$ is expressed as the following equation.

$$X[i+1]=X[i]+\Delta X[i]$$

$$\Delta X[i]=f(T[i])$$

Where, f( ) is a function indicating a relationship between the variation $\Delta X$ and the temperature T.

For example, the variation $\Delta X[i]$ may correspond to an average temperature Tave[i] in the period (i.e., the charging/discharging cycle) for which the battery 102 is charged/discharged with the predetermined amount of charges.

$$\Delta X[i]=f(Tave[i])$$

When $\Delta X$ is fixed to 1, the index X is equivalent to the charging/discharging cycle number. Therefore, the index X determined by the degradation calculation part 506 may be grasped as the charging/discharging cycle number revised in accordance with the use conditions such as temperature. The index X may be called a degradation cycle number.

An Arrhenius's law (also referred to as "10 degrees C. double speed" or "temperature double speed" that a speed of chemical reaction is doubled as a temperature is increased by 10 degrees C. is empirically known. The present inventor has uniquely recognized that the Arrhenius's law can be applied to degradation of a battery and the temperature dependency of cycle degradation of the battery can be suitably modeled. In this embodiment, the variation $\Delta X$ is defined based on the following equation (1) with respect to the average temperature Tave.

$$\Delta X=K\times M^{(Tave-Tr)/\Delta T} \qquad (1)$$

Where, K, M, Tr and $\Delta T$ are parameters.

Tr is a reference temperature (e.g., the room temperature) and may be set as 20 degrees C.$\leq$Tr$\leq$30 degrees C. In this embodiment, Tr=250 degrees C. M may be set as 1<M<3. In this embodiment, since a power of 2 can be easily implemented in hardware, M=2. $\Delta T$ may be set as 5 degrees C.≤ΔT≤20 degrees C. In this embodiment and other embodiments described later, ΔT is 10 degrees C. In this embodiment, K=1.

In addition, K, M, Tr and ΔT may be determined to have the most optimal values to fit to an actual battery degradation curve depending on the vendor, type, lot, individuals and so on of the battery 102. At least one of K, M, Tr and ΔT may be preferably set from the outside of the residual capacity detection circuit 200. Therefore, the residual capacity detection circuit 200 may further include a register for holding a setting value of at least one of K, M, Tr and ΔT and an interface circuit which receives a setting value from the outside and writes this value in the register.

The ΔX is varied according to the following equation (1) in at least a range of Tave>Tr. In this embodiment, the ΔX does not depend on the temperature in a range of Tave<Tr.

(1) Tave>Tr $$\Delta X = K \times M^{(Tave-Tr)/\Delta T}$$

(2) Tave<Tr $$\Delta X = K$$

The degradation calculation part 506 estimates the capacity of a degraded battery based on the index X according to a predetermined relational equation. More specifically, assuming that the rated battery capacity is $C_{CFULL\_RATED}$, the degraded battery capacity $CC_{FULL\_AGED}$ is estimated according to the following equation (2).

$$CC_{FULL\_AGED} = C_{CFULL\_RATED} - X \times \alpha \quad (2)$$

Where, α represents a degradation coefficient and its unit is coulomb.

That is, the battery capacity (coulomb count capacity) $CC_{FULL\_AGED}$ is decreased according to the equation (2) based on the index (degradation cycle number) X. The degradation coefficient α may be a constant but may be a variable in eighth to tenth embodiments described later. The SOC calculation part 206 can calculate SOC (%) based on the degraded battery capacity $CC_{FULL\_AGED}$ in consideration of degradation.

$$SOC = (CC_{FULL\_AGED} - ACC)/CC_{FULL\_AGED} \times 100$$

Figure 5:
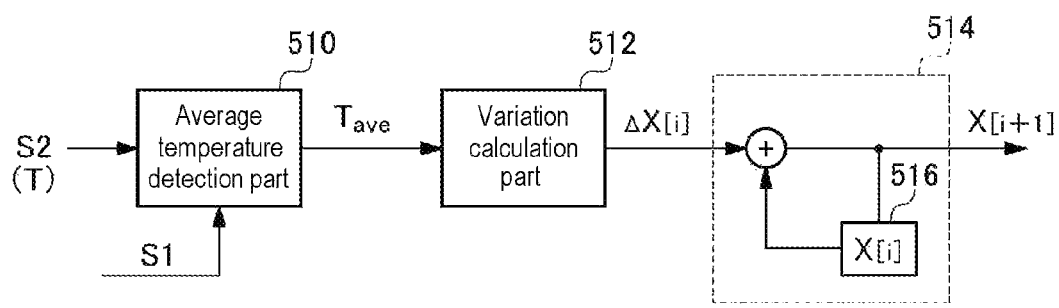
FIG. 5 is a block diagram illustrating a configuration example of a degradation calculation part.

FIG. 5 is a block diagram illustrating a configuration example of the degradation calculation part 506. The degradation calculation part 506 includes an average temperature detection part 510, a variation calculation part 512 and an index calculation part 514. The average temperature detection part 510 detects the average temperature Tave[1] of the current ($i^{th}$) charging/discharging cycle based on the temperature information S2 of the temperature detection circuit 504. The variation calculation part 512 calculates the variation ΔX based on equation (1). In the specification, the term "calculation" includes calculation by software or hardware and other means such as table reference. The index calculation part 514 determines a new degradation cycle number X[i+1] by adding the variation ΔX[i] to the current degradation cycle number X[i] held in a register 516 and stores a value of the degradation cycle number X[i+1] in the register 516. The degradation calculation part 506 may be implemented with hardware, a processor executing software, or a combination thereof.

Figure 6:
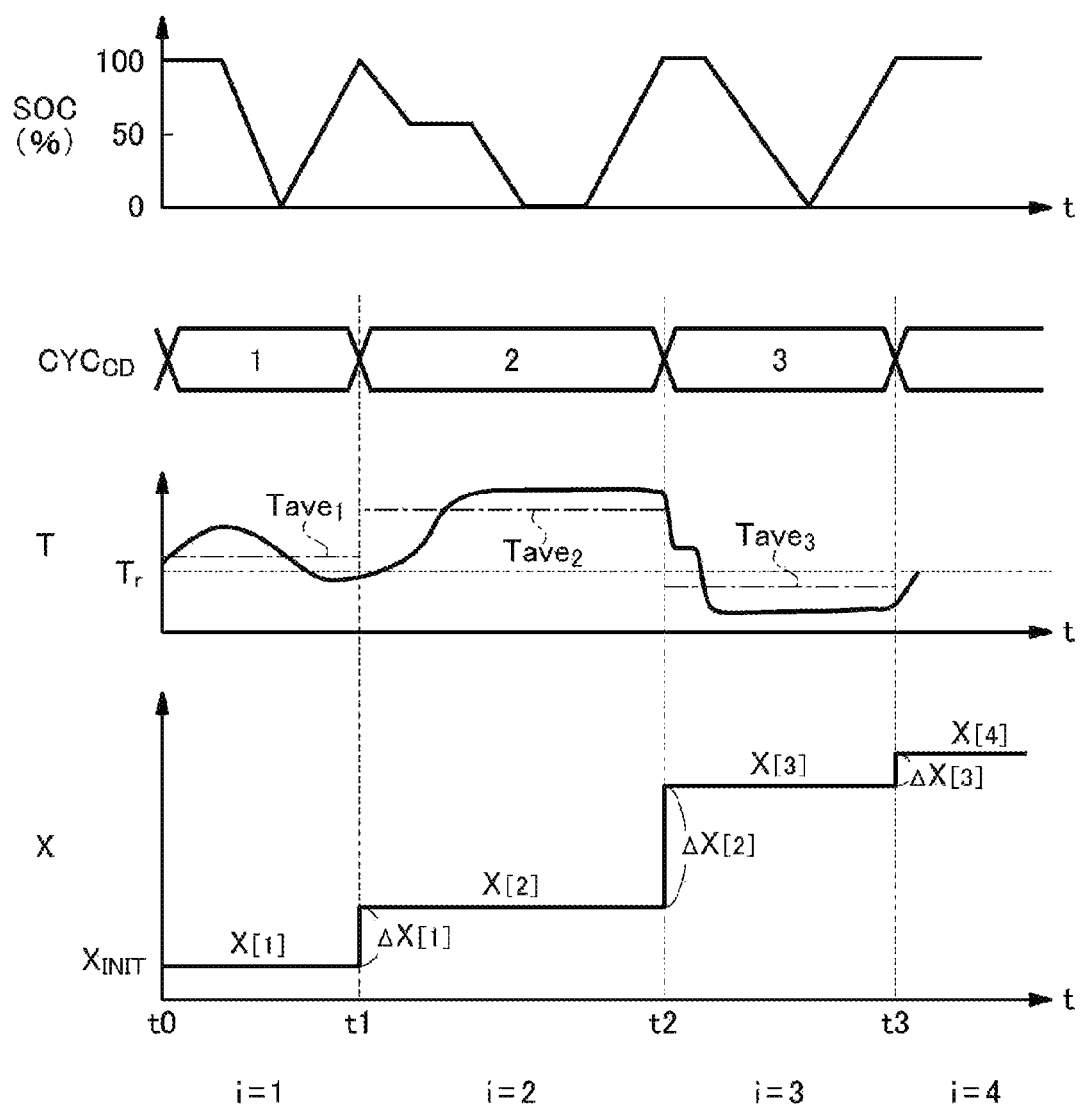
FIG. 6 is an operation waveform chart of the battery management system of FIG. 3.

The configuration of the battery management system 100 according to the first embodiment has been described above. Subsequently, the operation thereof will be described. FIG. 6 is an operation waveform chart of the battery management system 100 of FIG. 3. In FIG. 6, SOC, a charging/discharging cycle number $CYC_{CD}$, a temperature T and an index (degradation cycle number) X are shown in this order from top. Here, for the purpose of easy understanding, the charging/discharging cycle number $CYC_{CD}$ starts from 1. At time t1, count of the first cycle is completed. An average of the temperature T in a period from time t0 to time t1 is $Tave_1$. For example, when Tr=25 degrees C., $Tave_1$=45 degrees C., ΔT=10 degrees C. and K=1, the variation ΔX[1]=1× $2^{(45-25)/10}$=4 and the degradation cycle number X[2]=X[1]+4=$X_{INIT}$+4. That is, in the first charging/discharging cycle, it is estimated that the battery 102 is degraded by four cycles.

At time t2, count of the second cycle is completed. An average of the temperature T in a period from time t1 to time t2 is $Tave_2$. For example, when $Tave_2$=35 degrees C., the variation ΔX[2]=1×$2^{(35-25)/10}$=2 and the degradation cycle number X[3]=X[2]+2=$X_{INIT}$+6. That is, in the second charging/discharging cycle, it is estimated that the battery 102 is degraded by two cycles.

At time t3, count of the third cycle is completed. An average of the temperature T in a period from time t2 to time t3 is $Tave_3$. For example, when $Tave_3$=20 degrees C., since $Tave_3$<Tr, the variation ΔX[2]=1 and the degradation cycle number X[4]=X[3]+1=$X_{INIT}$+7. That is, in the third charging/discharging cycle, it is estimated that the battery 102 is degraded by one cycle.

The operation of the battery management system 100 of FIG. 3 has been described above. According to this battery management system 100, it is possible to adjust the state of progress (i.e., the variation ΔX) of cycle degradation depending on the temperature T during use of the battery 102. In particular, it is possible to increase the accuracy while suppressing increase in calculation load in consideration of the average time Tave.

(Second Embodiment)

Figure 7:
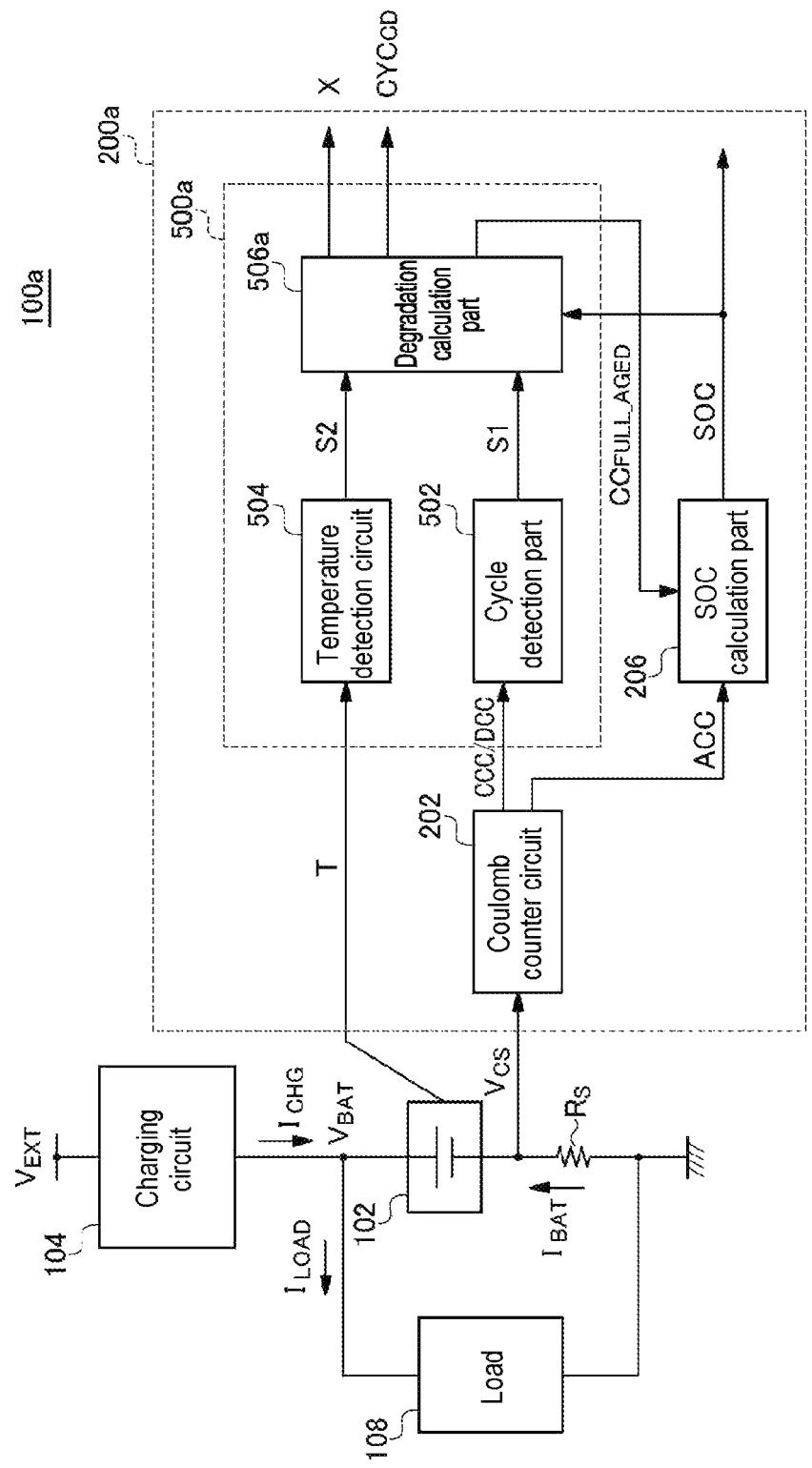
FIG. 7 is a block diagram of a battery management system including a degradation estimation circuit according to a second embodiment.

FIG. 7 is a block diagram of a battery management system 100a including a degradation estimation circuit 500a according to a second embodiment. In the degradation estimation circuit 500a, a SOC determined by the SOC calculation part 206 is input to a degradation calculation part 506a. Then, the SOC of the battery is reflected in the variation ΔX of the degradation cycle number X. In general, it is known that degradation progresses faster in a larger SOC region than in a smaller SOC region. Thus, by adjusting the variation ΔX in response to the SOC, it is possible to increase the accuracy of estimation of the state of degradation.

When ΔX is described in equation (1), the SOC may be reflected in the parameter K. For example, the SOC of the battery 102 is divided into a plurality of ranges. Here, for the purpose of easy understanding and concise explanation, it is assumed that the SOC is divided into two ranges, i.e., an upper range (i.e., 50 to 100%) higher than a predetermined threshold $SOC_{TH}$ (50% in this embodiment) and a lower range (0 to 500%) lower than the predetermined threshold $SOC_{TH}$. The value of the threshold $SOC_{TH}$ and the number of ranges are not particularly limited. In addition, the parameter K in equation (1) has different values for different SOC ranges. That is, K=$\beta_1$ for 50%≤SOC≤100% and K=$\beta_2$ for 0%≤SOC≤50%. $\beta_1$ and $\beta_2$ are determined to meet the relationship of $\beta_1+\beta_2$=1.

In short, the variation ΔX may be determined as follows.

(1) Tave>Tr $$\Delta X = \beta_1 \times M^{(Tave-Tr)/\Delta T} \text{ for } 50\% \leq SOC \leq 100\%$$

$$\Delta X = \beta_2 \times M^{(Tave-Tr)/\Delta T} \text{ for } 0\% \leq SOC \leq 50\%$$

(2) Tave<Tr $$\Delta X = \beta_1 \text{ for } 50\% \leq SOC \leq 100\%$$

$$\Delta X = \beta_2 \text{ for } 0\% \leq SOC \leq 50\%$$

For example, the degradation calculation part 506 detects the average temperature Tave for each of the SOC ranges. The average temperature in the upper range 50%≤ SOC≤100% is denoted by TaveH and the average temperature in the lower range 0%≤SOC≤50% is denoted by TaveL.

If the SOC is changed in one range (e.g., the upper range) in one charging/discharging cycle, the variation ΔX may be calculated as follows based on the average temperature TaveH.

$$\Delta X = \Delta X_H = \beta_1 \times M^{(Tave-Tr)/\Delta T} \text{ for } Tave > Tr$$

$$\Delta X = \Delta X_H = \beta_1 \text{ for } Tave < Tr$$

Similarly, if the SOC is changed in the other range (e.g., the lower range) in one charging/discharging cycle, the variation ΔX may be calculated as follows based on the average temperature TaveL.

$$\Delta X = \Delta X_L = \beta_2 \times M^{(TaveL-Tr)/\Delta T} \text{ for } Tave > Tr$$

$$\Delta X = \Delta X_L = \beta_2 \text{ for } Tave < Tr$$

If the SOC is changed beyond the plurality of ranges in one charging/discharging cycle, the variation ΔX may be an average of the variations $\Delta X_H$ and $\Delta X_L$ calculated for each of the plurality of ranges.

$$\Delta X = (\Delta X_H + \Delta X_L)/2 \quad (3)$$

In this case, the degradation cycle number X is expressed by the following equation (4)

$$X[i+1] = X[i] + \Delta X = X[i] + (\Delta X_H + \Delta X_L)/2 \quad (4)$$

Alternatively, the degradation cycles $X_H$ and $X_L$ may be individually calculated for each of the SOC ranges and an average of the calculated degradation cycles $X_H$ and $X_L$ may be taken as the degradation cycle number X of one charging/discharging cycle.

$$X_H[i+1] = X[i] + \Delta X_H[i]$$

$$X_L[i+1] = X[i] + \Delta X_L[i]$$

$$X[i+1] = (X_H[i+1] + X_L[i+1])/2 = X[i] + (\Delta X_H + \Delta X_L)/2 \quad (5)$$

Equation (5) matches equation (4).

Figure 8:
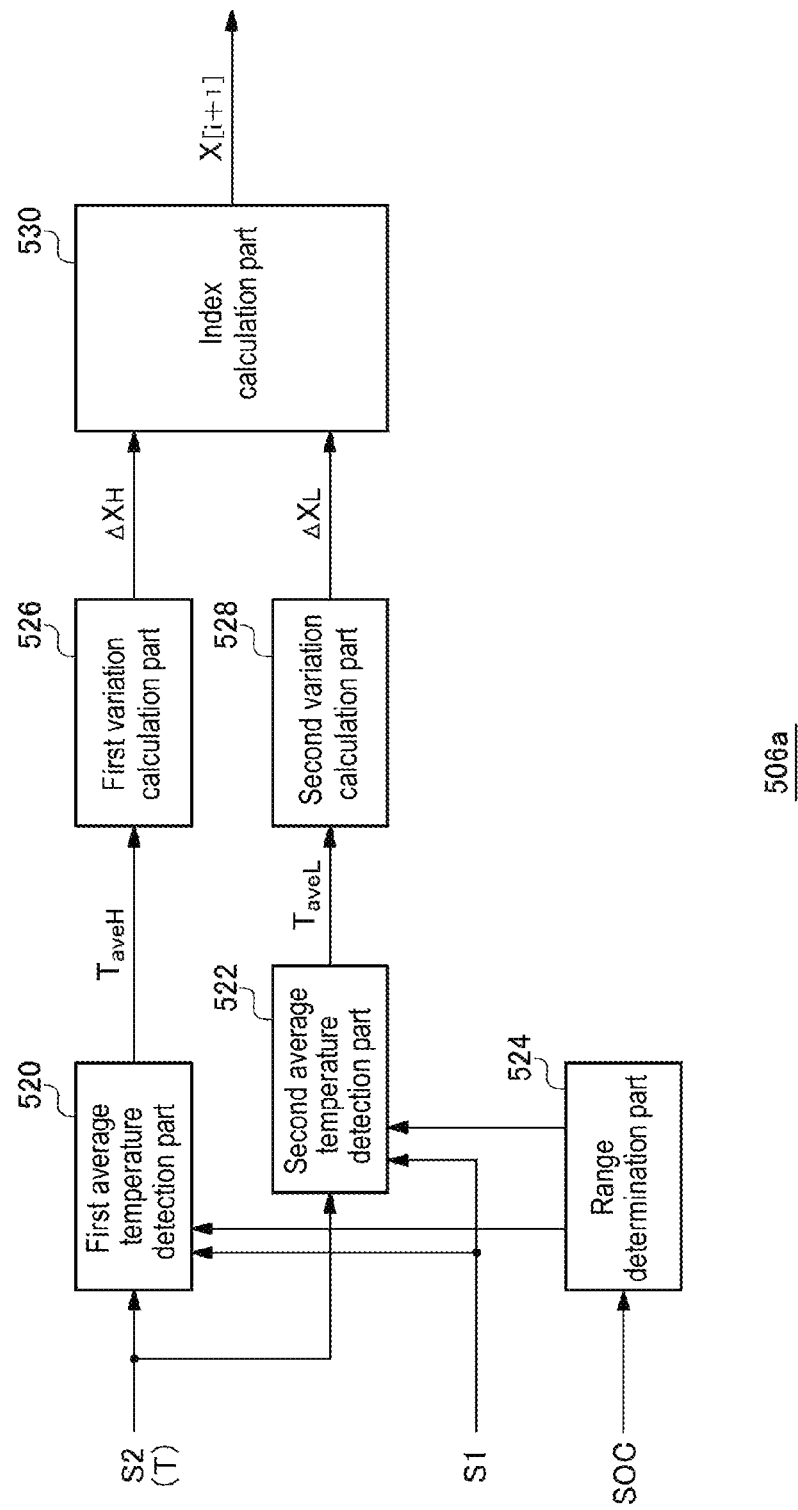
FIG. 8 is a block diagram illustrating a configuration example of a degradation calculation part of FIG. 7.

FIG. 8 is a block diagram illustrating a configuration example of the degradation calculation part 506a of FIG. 7. A range determination part 524 determines whether or not the current SOC is included in one of the plurality of ranges. In a period included in the upper range, a first average temperature detection part 520 is effective and the average temperature TaveH is updated. On the contrary, in a period included in the lower range, a second average temperature detection part 522 is effective and the average temperature TaveL is updated. A first variation calculation part 526 calculates the variation $\Delta X_H$ of the upper range based on the average temperature TaveH. A second variation calculation part 528 calculates the variation $\Delta X_L$ of the lower range based on the average temperature TaveL. An index calculation part 530 calculates the degradation cycle number X[i+1] based on the variations $\Delta X_H$ and $\Delta X_L$.

Figure 9:
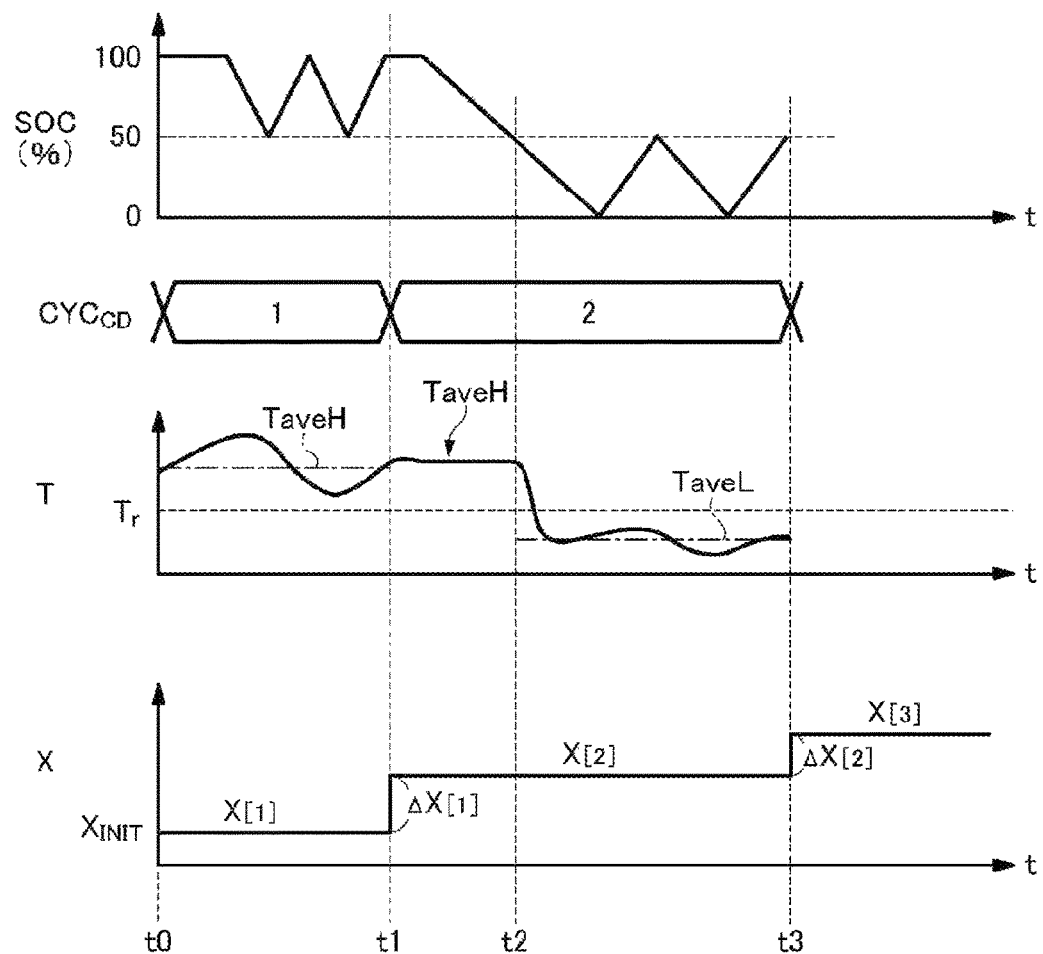
FIG. 9 is an operation waveform chart of the battery management system of FIG. 7.

The configuration of the battery management system 100a according to the second embodiment has been described above. Subsequently, the operation thereof will be described. FIG. 9 is an operation waveform chart of the battery management system 100a of FIG. 7. At time t1, count of the first cycle is completed. In a period from time t0 to time t1, since SOC>50%, the upper range is determined and TaveH is accordingly calculated as the average of the temperature T. Since TaveH>Tr, the variation ΔX[1] is as follows.

$$\Delta X[1] = \beta_1 \times M^{(TaveH-Tr)/\Delta T}$$

At time t3, count of the second cycle is completed. In the first half portion (t1 to t2) of the period from time t1 to time t3, since SOC>50%, the upper range is determined and the average temperature TaveH is accordingly calculated. In the first half portion (t2 to t3), since SOC<50%, the lower range is determined and the average temperature TaveL is accordingly calculated.

Since $TaveH > Tr, \Delta X_H[2] = \beta_1 \times M^{(TaveH-Tr)/\Delta T}$.

Since $TaveL < Tr, \Delta X_L[2] = \beta_2$.

Therefore, the variation ΔX[2] of the second cycle is ($\Delta X_H[2] + \Delta X_L[2]$). The operation of the battery management system 100a of FIG. 7 has been described above.

According to the second embodiment, by reflecting the SOC, instead of the temperature T, in the variation ΔX of the degradation cycle number X, it is possible to increase the accuracy of estimation of the state of degradation over the first embodiment.

(Third Embodiment)

Figure 10:
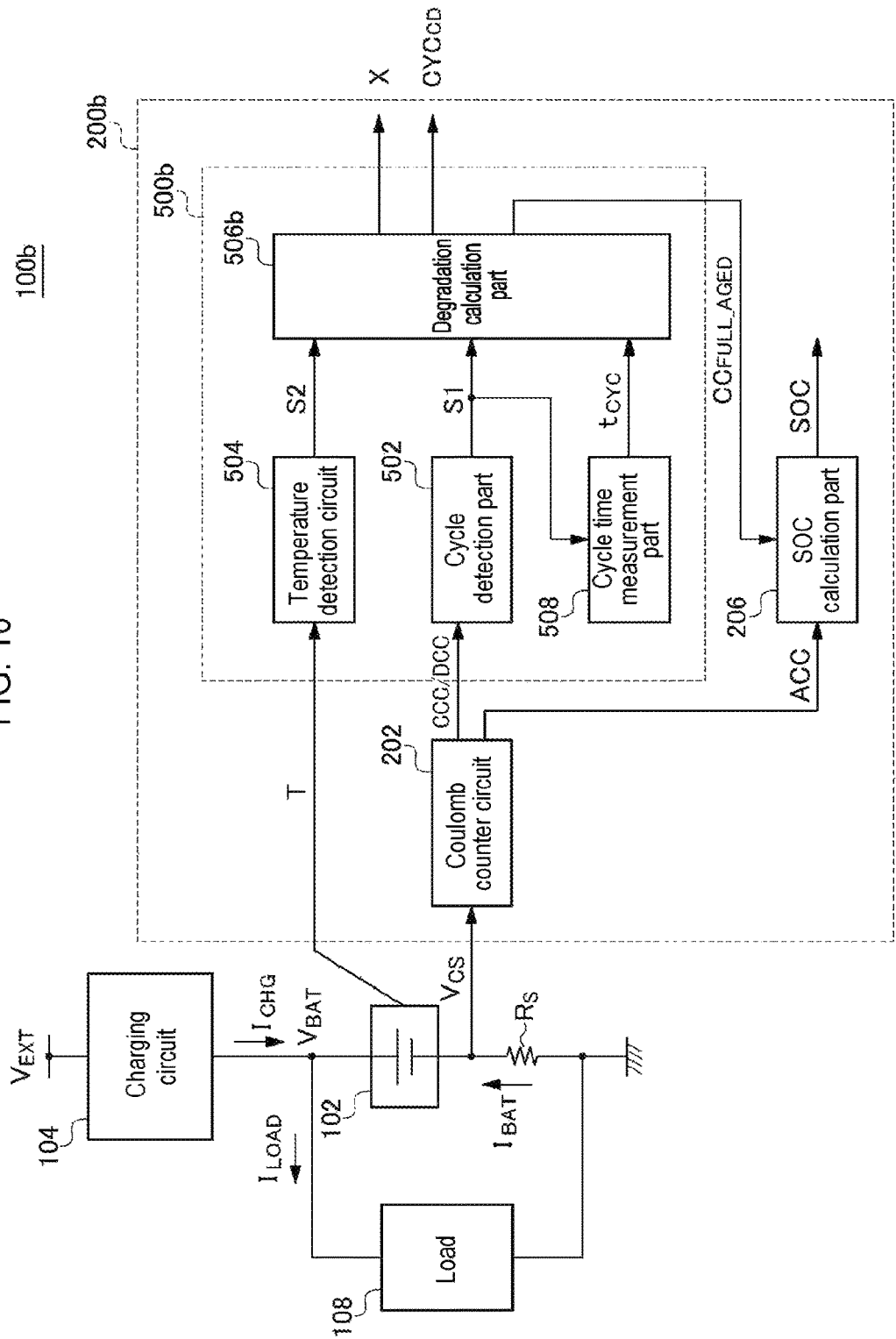
FIG. 10 is a block diagram of a battery management system including a degradation estimation circuit according to a third embodiment.

FIG. 10 is a block diagram of a battery management system 100b including a degradation estimation circuit 500b according to a third embodiment. The degradation estimation circuit 500b further includes a cycle time measurement part 508 which measures a cycle time $t_{CYC}$ required for each charging/discharging cycle. The variation ΔX depends on the length of the cycle time $t_{CYC}$.

For example, the cycle time $t_{CYC}$ is divided into a plurality of ranges. Here, for the purpose of easy understanding and concise explanation, it is assumed that the cycle time $t_{CYC}$ is divided into two ranges, i.e., a first range ($t_{CYC} > t_{TH}$) longer than a predetermined threshold $t_{TH}$ and a second range ($t_{CYC} < t_{TH}$) shorter than the predetermined threshold $t_{TH}$. However, the value of the threshold $t_{TH}$ and the number of ranges are not particularly limited. In addition, the parameter K in equation (1) has different values for different ranges of the cycle time $t_{CYC}$.

$$K = \gamma_1 \text{ for } t_{TH} > t_{CYC}$$

$$K = \gamma_2 \text{ for } t_{CYC} > t_{TH}$$

For example, $t_{TH}$ may be set to a value at which the first range is regarded as a region of so-called storage degradation.

In short, the variation ΔX may be determined as follows.
(1) Tave>Tr $$\Delta X = \gamma_1 \times M^{(Tave-Tr)/\Delta T} \text{ for } t_{TH} > t_{CYC}$$

$$\Delta X = \gamma_2 \times M^{(Tave-Tr)/\Delta T} \text{ for } t_{CYC} > t_{TH}$$

(2) Tave<Tr $$\Delta X = \gamma_1 \text{ for } t_{TH} > t_{CYC}$$

$$\Delta X = \gamma_2 \text{ for } t_{CYC} > t_{TH}$$

Figure 11:
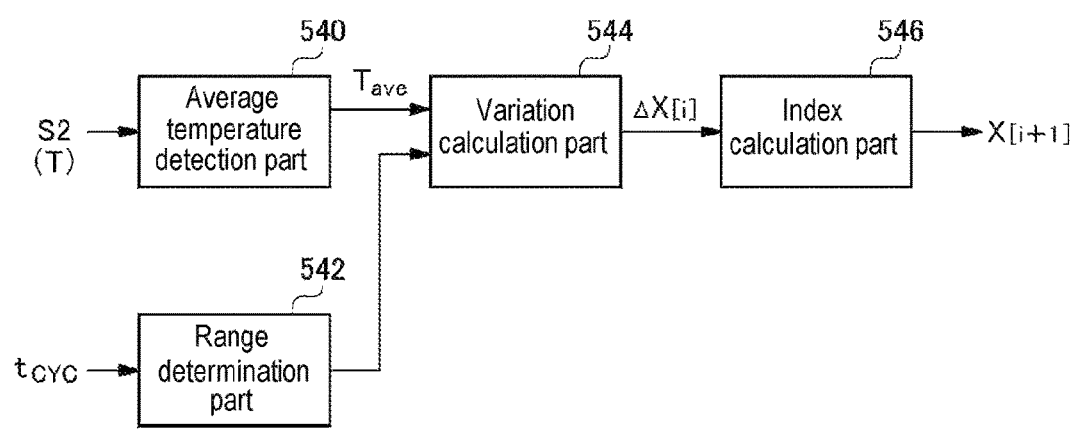
FIG. 11 is a block diagram illustrating a configuration example of a degradation calculation part of FIG. 10.

FIG. 11 is a block diagram illustrating a configuration example of the degradation calculation part 506b of FIG. 10. An average temperature detection part 540 acquires the average temperature Tave. A range determination part 542 determines whether or not the cycle time $t_{CYC}$ is included in one of the plurality of ranges. A variation calculation part 544 selects parameters ($\gamma_1$ and $\gamma_2$) depending on the length of the cycle time $t_{CYC}$ and calculates the variation ΔX depending on the average temperature Tave. An index calculation part 546 changes the degradation cycle number X by the variation ΔX.

Figure 12:
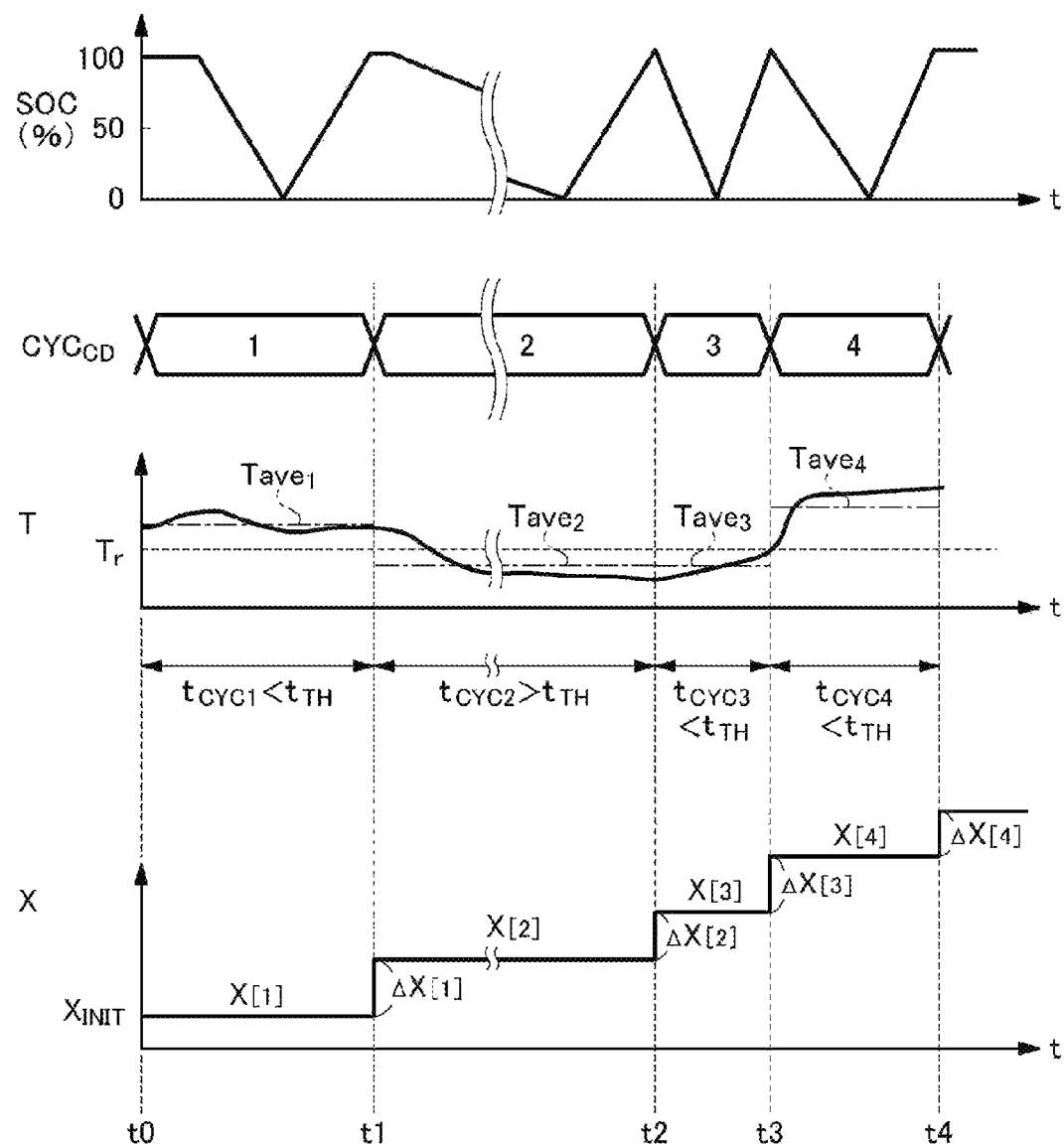
FIG. 12 is an operation waveform chart of the battery management system of FIG. 10.

The configuration of the battery management system 100b according to the third embodiment has been described above. Subsequently, the operation thereof will be described. FIG. 12 is an operation waveform chart of the battery management system 100b of FIG. 10. At times t1, t2, t3 and t4, count of the first to fourth cycles is completed, respectively. Cycle times $t_{CYC1}$, $t_{CYC3}$ and $t_{CYC4}$ are shorter than the threshold $t_{TH}$ and cycle time $t_{CYC2}$ is longer than the threshold $t_{TH}$. In addition, average temperatures Tave1 and Tave4 are higher than the threshold Tr and average temperatures Tave2 and Tave3 are lower than the threshold Tr.

Variations ΔX[1] to ΔX[4] of the cycles are as follows.

$$\Delta X[1] = \gamma_2 \times M^{(Tave1-Tr)/\Delta T}$$

$$\Delta X[2] = \gamma_1$$

$$\Delta X[3] = \gamma_2$$

$$\Delta X[4] = \gamma_2 \times M^{(Tave4-Tr)/\Delta T}$$

The operation of the battery management system 100b of FIG. 10 has been described above. According to the battery management system 100b, in a case where $t_{CYC} < t_{TH}$, i.e., degradation by normal use is estimated and in a case where $t_{CYC} > t_{TH}$, i.e., storage degradation is estimated, by using the parameter K having different values, it is possible to reflect the storage degradation in the degradation cycle number X.

(Fourth Embodiment)

A fourth embodiment is a combination of the second embodiment and the third embodiment. That is, the SOC and the cycle time $t_{CYC}$ are reflected in the index (degradation cycle number) X.

In this case, the variation ΔX may be calculated as follows.

(1) TaveH and TaveL>Tr
(1a) $t > t_{CYC}$ $$\Delta X_H = \gamma_1 \times \beta_1 \times M^{(TaveH-Tr)/\Delta T}$$

$$\Delta X_L = \gamma_1 \times \beta_2 \times M^{(TaveL-Tr)/\Delta T}$$

$$\Delta X = (\Delta X_H + \Delta X_L)/2$$

(1b) $t < t_{CYC}$ $$\Delta X_H = \gamma_2 \times \beta_1 \times M^{(TaveH-Tr)/\Delta T}$$

$$\Delta X_L = \gamma_2 \times \beta_2 \times M^{(TaveL-Tr)/\Delta T}$$

$$\Delta X = (\Delta X_H + \Delta X_L)/2$$

(2) TaveH and TaveL<Tr
(2a) $t > t_{CYC}$ $$\Delta X_H = \gamma_1 \times \beta_1$$

$$\Delta X_L = \gamma_1 \times \beta_2$$

$$\Delta X = (\Delta X_H + \Delta X_L)/2$$

(2b) $t < t_{CYC}$ $$\Delta X_H = \gamma_2 \times \beta_1$$

$$\Delta X_L = \gamma_2 \times \beta_2$$

$$\Delta X = (\Delta X_H + \Delta X_L)/2$$

(3) TaveH>Tr and TaveL<Tr
(3a) $t > t_{CYC}$ $$\Delta X_H = \gamma_1 \times \beta_1 \times M^{(TaveH-Tr)/\Delta T}$$

$$\Delta X_L = \gamma_1 \times \beta_2$$

$$\Delta X = (\Delta X_H + \Delta X_L)/2$$

(3b) $t < t_{CYC}$ $$\Delta X_H = \gamma_2 \times \beta_1 \times M^{(TaveH-Tr)/\Delta T}$$

$$\Delta X_L = \gamma_2 \times \beta_2$$

$$\Delta X = (\Delta X_H + \Delta X_L)/2$$

(4) TaveH<Tr and TaveL>Tr
(4a) $t > t_{CYC}$ $$\Delta X_H = \gamma_1 \times \beta_1$$

$$\Delta X_L = \gamma_1 \times \beta_2 \times M^{(TaveL-Tr)/\Delta T}$$

$$\Delta X = (\Delta X_H + \Delta X_L)/2$$

(4b) $t < t_{CYC}$ $$\Delta X_H = \gamma_2 \times \beta_1$$

$$\Delta X_L = \gamma_2 \times \beta_2 \times M^{(TaveL-Tr)/\Delta T}$$

$$\Delta X = (\Delta X_H + \Delta X_L)/2$$

(Fifth Embodiment)

In a fifth embodiment, the temperature T is not reflected in the variation ΔX and the SOC and the cycle time $t_{CYC}$ are reflected in the variation ΔX. Therefore, a degradation estimation circuit 500c (not shown) according to the fifth embodiment may be obtained by excluding the temperature detection circuit 504 from the block diagram of FIG. 10. In the fifth embodiment, the variation ΔX may be determined as follows.

$$\Delta X[i] = g(SOC[i], t_{CYC}[i])$$

Where, g( ) is a function representing a relationship between the variation ΔX, the SOC and the $t_{CYC}$.

For example, ΔX[i] may be defined as follows.

(1) $t > t_{CYC}$ $$\Delta X_H = \gamma_1 \times \beta_1$$

$$\Delta X_L = \gamma_1 \times \beta_2$$

$$\Delta X = (\Delta X_H + \Delta X_L)/2$$

(2) $t < t_{CYC}$ $$\Delta X_H = \gamma_2 \times \beta_1$$

$$\Delta X_L = \gamma_2 \times \beta_2$$

$$\Delta X = (\Delta X_H + \Delta X_L)/2$$

(Sixth Embodiment)

Alternatively, only the SOC may be reflected in the variation ΔX.

$$\Delta X[i] = h1(SOC[i])$$

Where, h1( ) is a function representing a relationship between the variation ΔX and the SOC.

As another alternative, only the cycle time $t_{CYC}$ may be reflected in the variation ΔX.

$$\Delta X[i] = h2(t_{CYC}[i])$$

Where, h2( ) is a function representing a relationship between the variation ΔX and the $t_{CYC}$.

(Seventh Embodiment)

Figure 13:
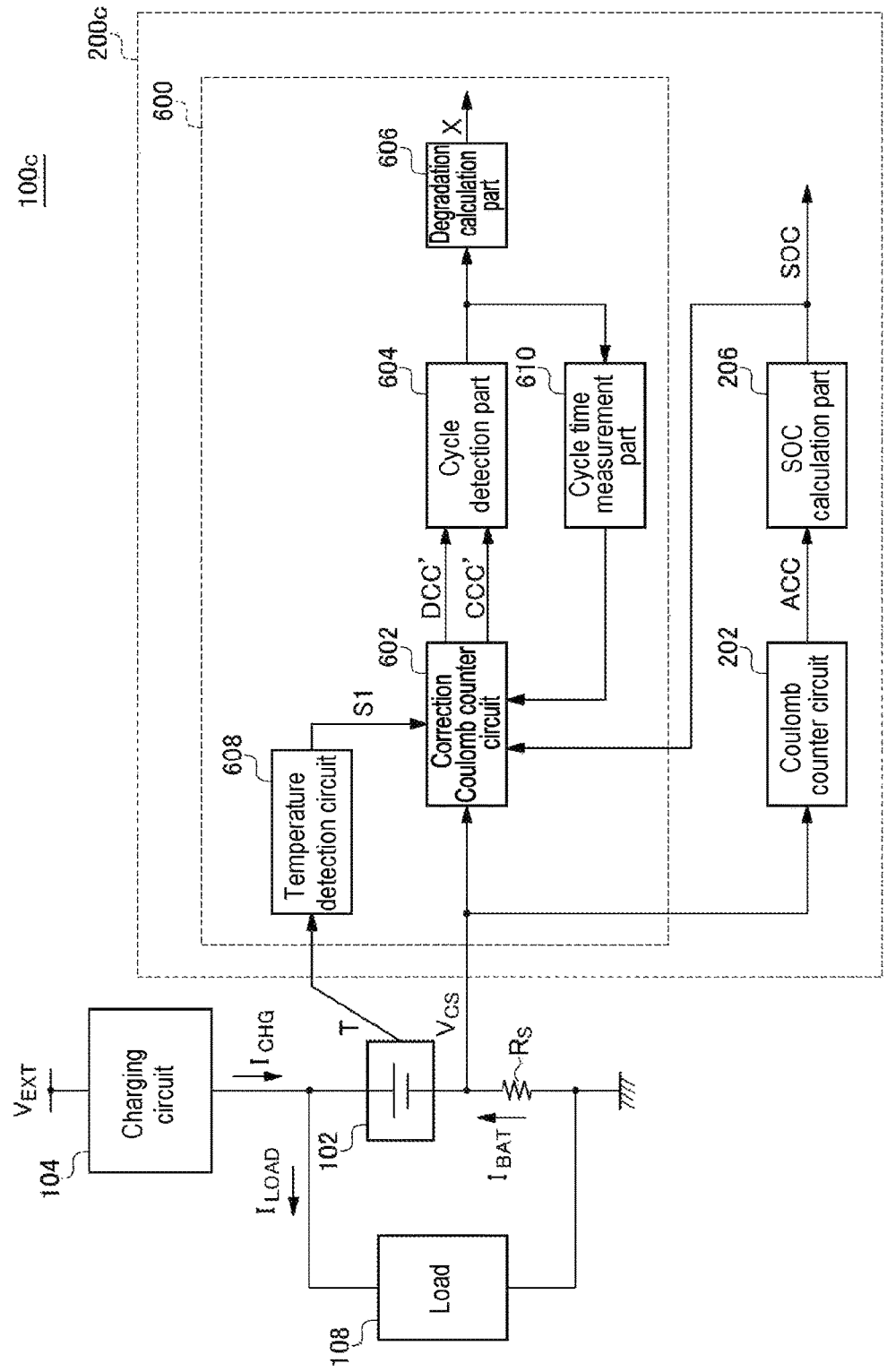
FIG. 13 is a block diagram of a battery management system including a residual capacity detection circuit according to a seventh embodiment.

FIG. 13 is a block diagram of a battery management system 100c including a residual capacity detection circuit 200c according to a seventh embodiment. The residual capacity detection circuit 200c includes a coulomb counter circuit 202, an SOC calculation part 206 and a degradation estimation circuit 600.

The degradation estimation circuit 600 mainly includes a correction coulomb counter circuit 602, a cycle detection part 604 and a degradation calculation part 606. The correction coulomb counter circuit 602 determines correction coulomb count values DCC' and CCC'. The cycle detection part 604 detects that the battery 102 is charged/discharged with a predetermined amount of charges (i.e., detects a charging/discharging cycle). The degradation calculation part 606 changes the index X indicating the degradation of the battery 102 by a predetermined amount every time the battery 102 is charged/discharged with the predetermined amount of charges. For example, if the index X corresponds to the degradation cycle number, the degradation cycle number is incremented by one every time the charging/discharging cycle is detected. In addition, the battery capacity, that is, the $CC_{FULL}$ value of the SOC calculation part 206 is updated in response to the degradation cycle number.

The correction coulomb counter circuit 602 corrects a variation of the correction coulomb count values DCC' and CCC' in response to at least one of the temperature T, the SOC and the cycle time $t_{CYC}$. A temperature detection circuit 608 and a cycle time measurement part 610 are provided as necessary.

For the typical coulomb counter circuit 202, when the amount of charging/discharging charges for any sampling j is $I_{BAT}[j]$, $CC[j+1]=CC[j]+\Delta t \times I_{BAT}[j]$. When $\Delta t$ is normalized to 1 for the purpose of concise explanation, $CC[j+1]=CC[j]+I_{BAT}[j]$.

In contrast, in the correction coulomb counter circuit 602, a correction coulomb count value CC' is calculated according to an equation $CC'[j+1]=\varepsilon[j] \times CC'[j]+I_{BAT}[j]$. Where, $\varepsilon$ is a correction coefficient in response to at least one of the temperature T, the SOC and the cycle time $t_{CYC}$. The above-mentioned $\Delta T$ may be construed to be included in $\varepsilon$. The correction coefficient $\varepsilon$ corresponds to the variation $\Delta X$ described in the first to fourth embodiments.

1. Temperature Dependency

When the correction coefficient $\varepsilon$ is the function of temperature T, the correction coefficient $\varepsilon$ may be considered in correspondence with the first embodiment or may be read as $\Delta X$. Therefore, E may be expressed as the following equation (1a) in a range of T>Tr.

$$\varepsilon = K \times M^{(T-Tr)/\Delta T} \quad (1a)$$

In this embodiment, the temperature T may be reflected in a time scale shorter than a period of the charging/discharging cycle, that is, a time scale of a count period of the coulomb counter.

2. SOC Dependency

Further, when the SOC is reflected, the SOC may be considered in correspondence with the second embodiment. In addition, in this embodiment, there is no need to calculate the average temperature Tave for each of SOC ranges. For example, the correction coefficient E may be calculated as follows.

(1) T>Tr
(1a) SOC>$SOC_{TH}$ $$\varepsilon = \beta_1 \times M^{(T-Tr)/\Delta T}$$

(1b) SOC<$SOC_{TH}$ $$\varepsilon = \beta_2 \times M^{(T-Tr)/\Delta T}$$

(2) T<Tr
(2a) SOC>$SOC_{TH}$ $$\varepsilon = \beta_1$$

(2b) SOC<$SOC_{TH}$ $$\varepsilon = \beta_2$$

3. Cycle Time Dependency

Further, when the cycle time $t_{CYC}$ is reflected, the cycle time $t_{CYC}$ may be considered in correspondence with the third embodiment.

(1) T>Tr
(1a) $t_{CYC}>t_{TH}$ and SOC>$SOC_{TH}$ $$\varepsilon = \gamma_1 \times \beta_1 \times M^{(T-Tr)/\Delta T}$$

(1b) $t_{CYC}>t_{TH}$ and SOC<$SOC_{TH}$ $$\varepsilon = \gamma_1 \times \beta_2 \times M^{(T-Tr)/\Delta T}$$

(1c) $t_{CYC}<t_{TH}$ and SOC>$SOC_{TH}$ $$\varepsilon = \gamma_2 \times \beta_1 \times M^{(T-Tr)/\Delta T}$$

(1d) $t_{CYC}<t_{TH}$ and SOC<$SOC_{TH}$ $$\varepsilon = \gamma_2 \times \beta_2 \times M^{(T-Tr)/\Delta T}$$

(2) T<Tr
(2a) $t_{CYC}>t_{TH}$ and SOC>$SOC_{TH}$ $$\varepsilon = \gamma_1 \times \beta_1$$

(2b) $t_{CYC}>t_{TH}$ and SOC<$SOC_{TH}$ $$\varepsilon = \gamma_1 \times \beta_2$$

(2c) $t_{CYC}<t_{TH}$ and SOC>$SOC_{TH}$ $$\varepsilon = \gamma_2 \times \beta_1$$

(2d) $t_{CYC}<t_{TH}$ and SOC<$SOC_{TH}$ $$\varepsilon = \gamma_2 \times \beta_2$$

Figure 14:
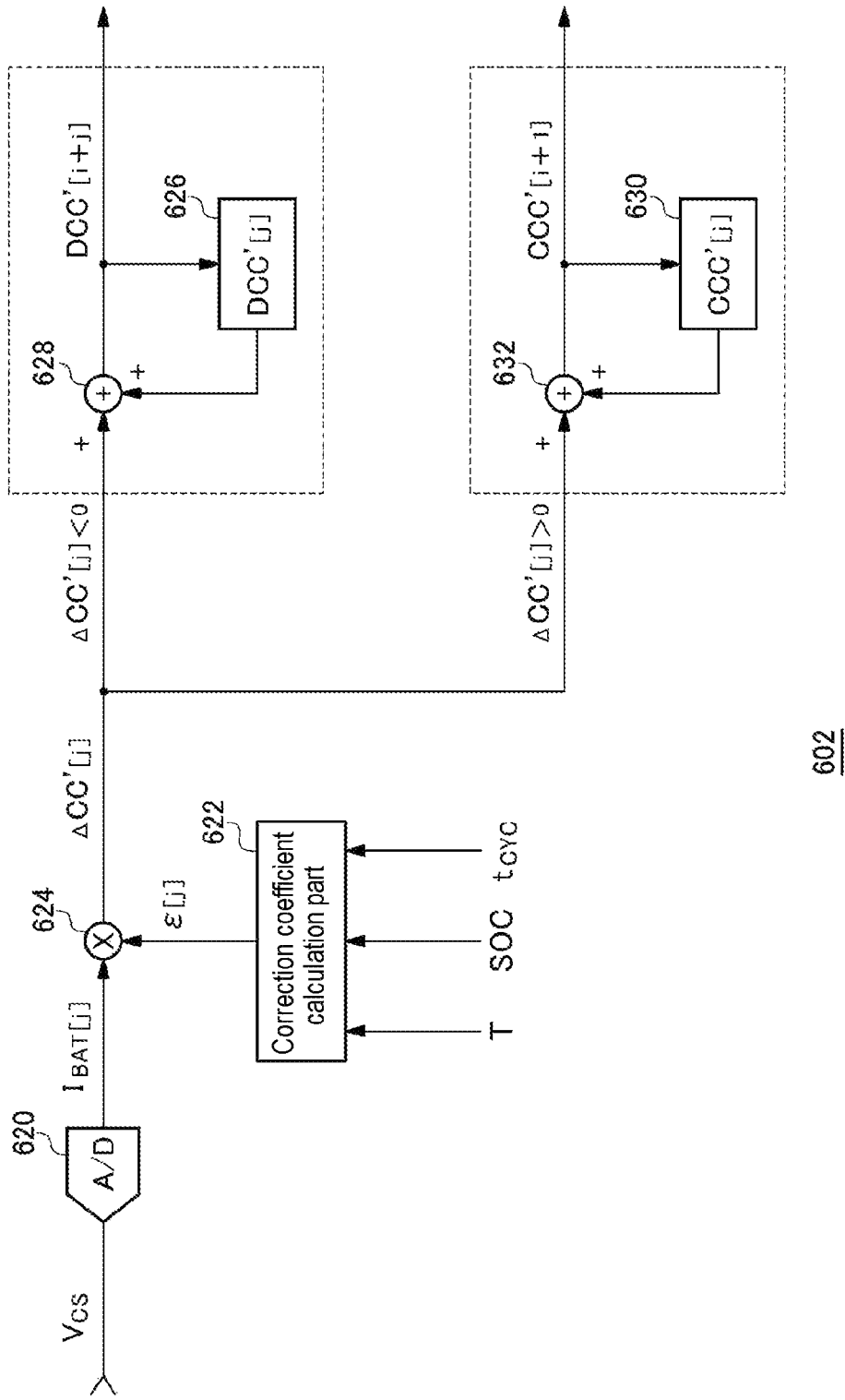
FIG. 14 is a block diagram of a correction coulomb counter circuit of FIG. 13.

FIG. 14 is a block diagram of the correction coulomb counter circuit 602 of FIG. 13. A configuration of calculating an ACC value is shown in FIG. 14. As described above, the sense resistor Rs is disposed on the path of the battery current (charging/discharging current) $I_{BAT}$ and the voltage drop Vcs proportional to the battery current $I_{BAT}$ is generated in the sense resistor Rs. $I_{BAT}$ is positive in charging and is negative in discharging. A current detection circuit 620 includes an A/D converter which converts the voltage drop Vcs into a digital value $I_{BAT}[j]$. Where, j represents a sampling time. The current detection circuit 620 may further include an amplifier which amplifies the voltage drop Vcs.

A correction coefficient calculation part 622 calculates a correction coefficient $\varepsilon[j]$ based on at least one of temperature T, SOC and $t_{CYC}$. A multiplier 624 multiplies $I_{BAT}[j]$ by $\varepsilon[j]$ to determine $\Delta CC'[j]$. $\Delta CC'[j]$ corresponds to a variation of the coulomb count value.

A register 626 holds the current DCC'[j]. When $\Delta CC'[j]$ is negative (i.e., in discharging), an adder 628 adds its value (or absolute value) to DCC'[j] of the register 626 to determine DCC'[j+1]. A value of the register 626 is updated by DCC'[j+1].

A register 630 holds the current CCC'[j]. When $\Delta CC'[j]$ is positive (i.e., in charging), an adder 632 adds its value (or absolute value) to CCC'[j] of the register 630 to determine CCC'[j+1]. A value of the register 630 is updated by CCC'[j+1].

(Eight Embodiment)

Figure 15:
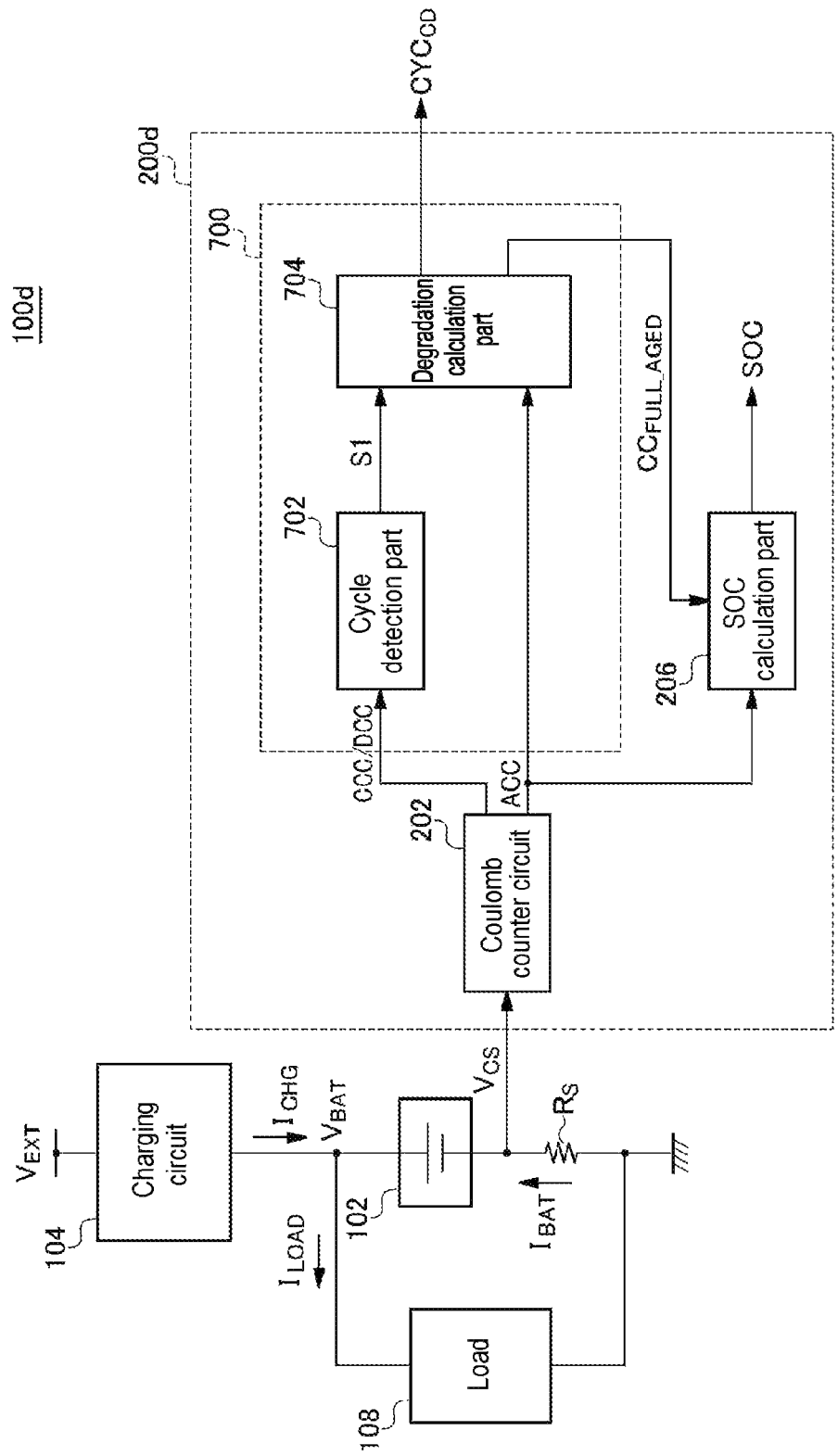
FIG. 15 is a block diagram of a battery management system according to an eighth embodiment.

FIG. 15 is a block diagram of a battery management system 100d according to an eighth embodiment. A residual capacity detection circuit 200d includes a coulomb counter circuit 202, an SOC calculation part 206 and a degradation estimation circuit 700. The function and operation of the coulomb counter circuit 202 and SOC calculation part 206 are described above.

The degradation estimation circuit 700 includes a cycle detection part 702 and a degradation calculation part 704. Upon detecting a charging/discharging cycle, the cycle detection part 702 asserts a detection signal 51.

The degradation calculation part 704 increments a charging/discharging cycle number $CYC_{CD}$ by one every time the detection signal 51 is asserted.

In addition, upon receiving an ACC value from the coulomb counter circuit 202, the degradation calculation part 704 calculates degradation of the battery capacity, that is, the battery capacity $CC_{FULL\_AGED}$. In this embodiment, the degradation coefficient $\alpha$ in equation (2) used to calculate the degraded battery capacity $CC_{FULL\_AGED}$ may be handled as a variable and may be updated every charging/discharging cycle.

The degradation calculation part 704 calculates a degraded battery capacity $CC_{FULL\_AGED\_EST1}$ for estimation. In this embodiment, $CC_{FULL\_AGED\_EST1}$ is equal to $CC_{FULL\_AGED}$ in equation (2).

$$CC_{FULL\_AGED\_EST1} = CC_{FULL\_RATED} - CYC_{CD} \times \alpha \quad (2a)$$

In addition, the degradation calculation part 704 calculates a current residual coulomb count value CCNOW which is not indicative of the battery degradation. CCNOW represents the amount of charges remaining in the battery.

$$CCNOW = CC_{FULL\_RATED} - ACC \quad (7a)$$

Further, the degradation calculation part 704 calculates a current residual coulomb count value CCNOW_EST1 which is indicative of the battery degradation.

$$CCNOW\_EST1 = CCNOW - (CC_{FULL\_RATED} - CC_{FULL\_AGED\_EST1}) = CC_{FULL\_AGED\_EST1} - ACC \quad (7b)$$

When the residual coulomb count value CCNOW_EST1 indicative of the battery degradation becomes zero, if the battery $V_{BAT}$ does not reach a voltage (system minimum operating voltage) $V_{BAT\_MIN}$ corresponding to the residual capacity of zero, the current residual coulomb count value CCNOW at that time is denoted by ERR_CC.

The degradation calculation part 704 may calculate SOC_EST1 according to the following equation (8) and take the current residual coulomb count value CCNOW, which is obtained when a value of SOC_EST1 becomes zero, as ERR_CC. Since this SOC_EST1 does not differ from the SOC calculated in the SOC calculation part 206, the degradation calculation part 704 may monitor an output of the SOC calculation part 206.

$$SOC\_EST1 = CCNOW\_EST1/CC_{FULL\_AGED\_EST1} \times 100 = (CC_{FULL\_AGED\_EST1} - ACC)/CC_{FULL\_AGED\_EST1} \times 100 \quad (8)$$

The degradation calculation part 704 uses ERR_CC to correct a degradation coefficient $\alpha$ which is used as the degradation coefficient $\alpha$ in equation (2) in a later cycle. For example, a corrected degradation coefficient $\alpha'$ may be calculated according to the following equation (9).

$$\alpha' = (\alpha + ERR\_CC)/CYC_{CD} \quad (9)$$

In addition, a correction equation is not limited thereto but may be defined such that $\alpha'$ becomes larger than a for ERR_CC and increases monotonically with respect to ERR_CC. The correction equation may be generalized using any function f as follows.

$$\alpha' = f(ERR\_CC, \alpha) \quad (10)$$

Where, when ERR_CC1>ERR_CC2, the function f satisfies a relationship of f(ERR_CC1, $\alpha$)>f(ERR_CC2, $\alpha$).

Figure 16:
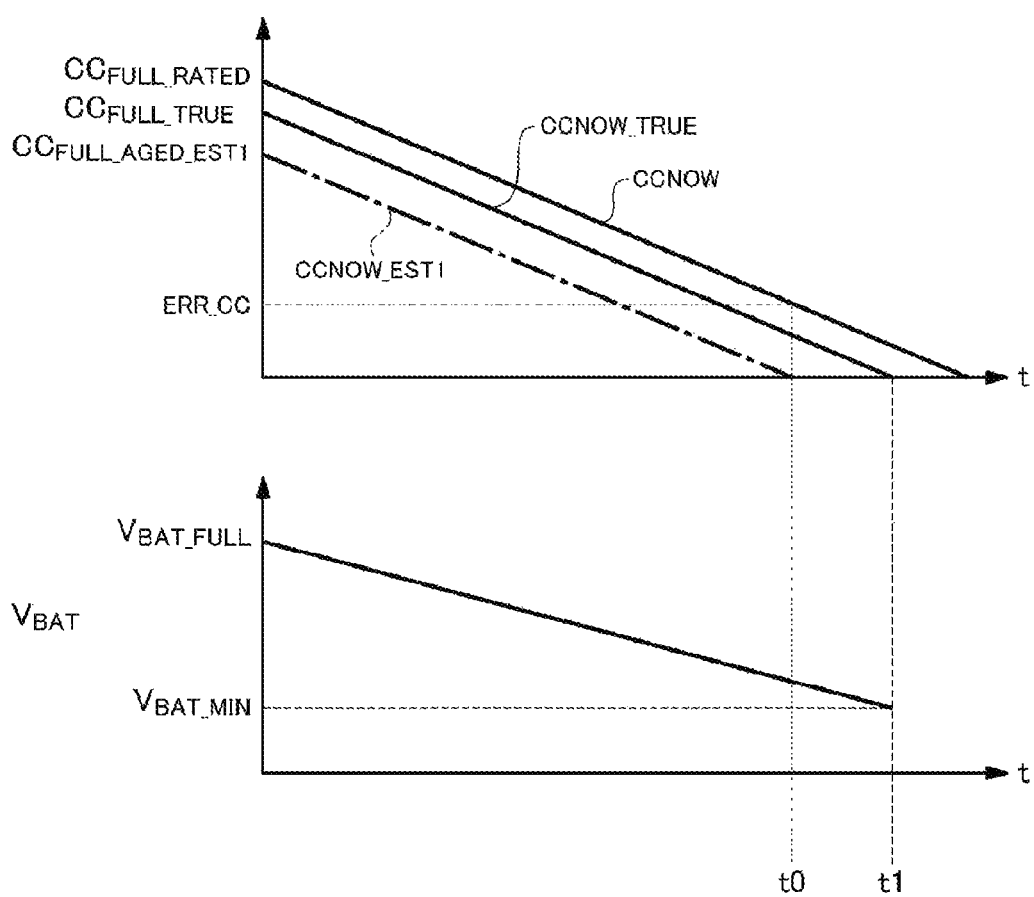
FIG. 16 is an operation waveform chart of the battery management system $100d$ according to the eighth embodiment.

The configuration of the residual capacity detection circuit 200d. Subsequently, the operation thereof will be described. FIG. 16 is an operation waveform chart of the battery management system 100d of FIG. 15. When the battery 102 is discharged with a load current $I_{LOAD}$, a CCNOW value and a CCNOW_EST1 value are lowered with time. An initial value $CC_{FULL\_AGED\_EST1}$ of CCNOW_EST1 is a value estimated from a past charging/discharging cycle number based on equation (2a). CCNOW_TRUE represents the correct amount of charges.

In addition, the battery voltage $V_{BAT}$ is lowered from the full-charging voltage $V_{BAT\_FULL}$ with time. The battery voltage $V_{BAT}$ becomes the minimum operating voltage VBAT_MIN at time t1 at which the correct amount of charges CCNOW_TRUE becomes zero. When the initial value (battery capacity) $CC_{FULL\_AGED\_EST1}$ is smaller than a correct value $CC_{FULL\_TRUE}$, CCNOW_EST1 becomes zero at time t0 previous to time t1 at which the battery is empty.

The degradation calculation part 704 acquires ERR_CC, which is a value of CCNOW at time t0, and corrects the degradation coefficient $\alpha$. Then, the corrected degradation coefficient $\alpha$ is used to calculate the degraded battery capacity $CC_{FULL\_AGED}$ according to equation (2a). In addition, the degraded battery capacity $CC_{FULL\_AGED\_EST1}$ for estimation is calculated.

Figure 17:
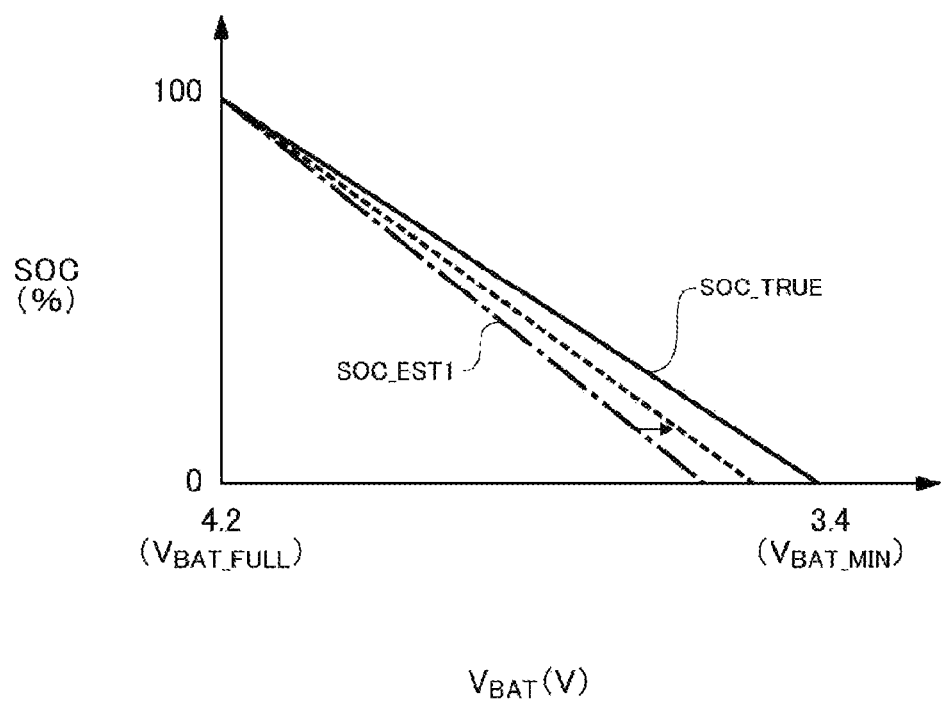
FIG. 17 is a view showing a relationship between a battery voltage $V_{BAT}$ and SOC in the eighth embodiment.

FIG. 17 is a view showing a relationship between the battery voltage $V_{BAT}$ and SOC. Here, for the shake of brevity, it is assume that $V_{BAT}$ and SOC are linear, although they are nonlinear in actuality. A solid line represents correct SOC_TRUE. If the estimation of the degraded battery capacity $CC_{FULL\_AGED}$ is smaller than the true value $CC_{FULL\_TRUE}$, SOC_EST1 becomes zero despite the fact that charges remain, that is, the battery voltage VBAT does not reach the minimum operating voltage $V_{BAT\_MIN}$, as indicated by a dashed line.

In the battery management system 100d of FIG. 15, upon detecting this state, the degradation coefficient $\alpha$ is corrected according to equation (8) or a different function f. Thus, the degraded battery capacity $CC_{FULL\_AGED}$ is corrected in an increasing way and SOC_EST1 after that can be corrected to approach the correct SOC (SOC_TRUE), as indicated by a broken line in FIG. 17.

The operation of the residual capacity detection circuit 200d has been described above. By correcting the degradation coefficient $\alpha$, it is possible to increase the degree of estimation of the battery degradation.

(Ninth Embodiment)

In the eighth embodiment, when the degraded battery capacity $CC_{FULL\_AGED}$ is estimated to be smaller than the correct value, the value thereof can be corrected. However, if the degraded battery capacity $CC_{FULL\_AGED}$ is estimated to be larger than the correct value, the value thereof cannot be corrected. A ninth embodiment provides a technique effective for such a case.

A block diagram of a battery management system according to the ninth embodiment is different in the process by the degradation calculation part 704, like FIG. 15. The degradation calculation part 704 calculates a degraded battery capacity $CC_{FULL\_AGED\_EST2}$ in the following equation (2b) instead of equation (2a). This $CC_{FULL\_AGED\_EST2}$ is referenced to correct the degradation coefficient $\alpha$ instead of $CC_{FULL\_AGED}$ used in the SOC calculation part 206.

$$CC_{FULL\_AGED\_EST2} = CC_{FULL\_RATED} - CYC_{CD} \times \alpha \times N \quad (2b)$$

Where, N is an integer (N>1).

In addition, a current residual coulomb count value CCNOW_EST2 indicative of the battery degradation is calculated based on the following equation (7b).

$$\text{CCNOW\_EST2} = \text{CCNOW} - (CC_{FULL\_RATED} - CC_{FULL\_AGED\_EST2}) = CC_{FULL\_AGED\_EST2} - \text{ACC} \quad (7b)$$

In addition, the degradation calculation part 704 calculates SOC_EST2 according to the following equation (8b) instead of equation (8). In the ninth embodiment, it is noted that SOC_EST2 is different from the SOC calculated by the SOC calculation part 206.

$$\text{SOC\_EST2} = \text{CCNOW\_EST2}/CC_{FULL\_AGED\_EST2} \times 100 = (CC_{FULL\_AGED\_EST2} - \text{ACC})/(CC_{FULL\_AGED\_EST2} \times 100) \quad (8b)$$

The degradation calculation part 704 takes the current residual coulomb count value CCNOW, which is obtained when the SOC_EST2 calculated in equation (8b) becomes zero, that is, when CCNOW_EST2 is zero, as ERR_CC. The degradation calculation part 704 uses ERR_CC to correct the degradation coefficient α. The correction may be made using equation (9) or a different function f.

Subsequently, the operation of the ninth embodiment will be described.

Figure 18:
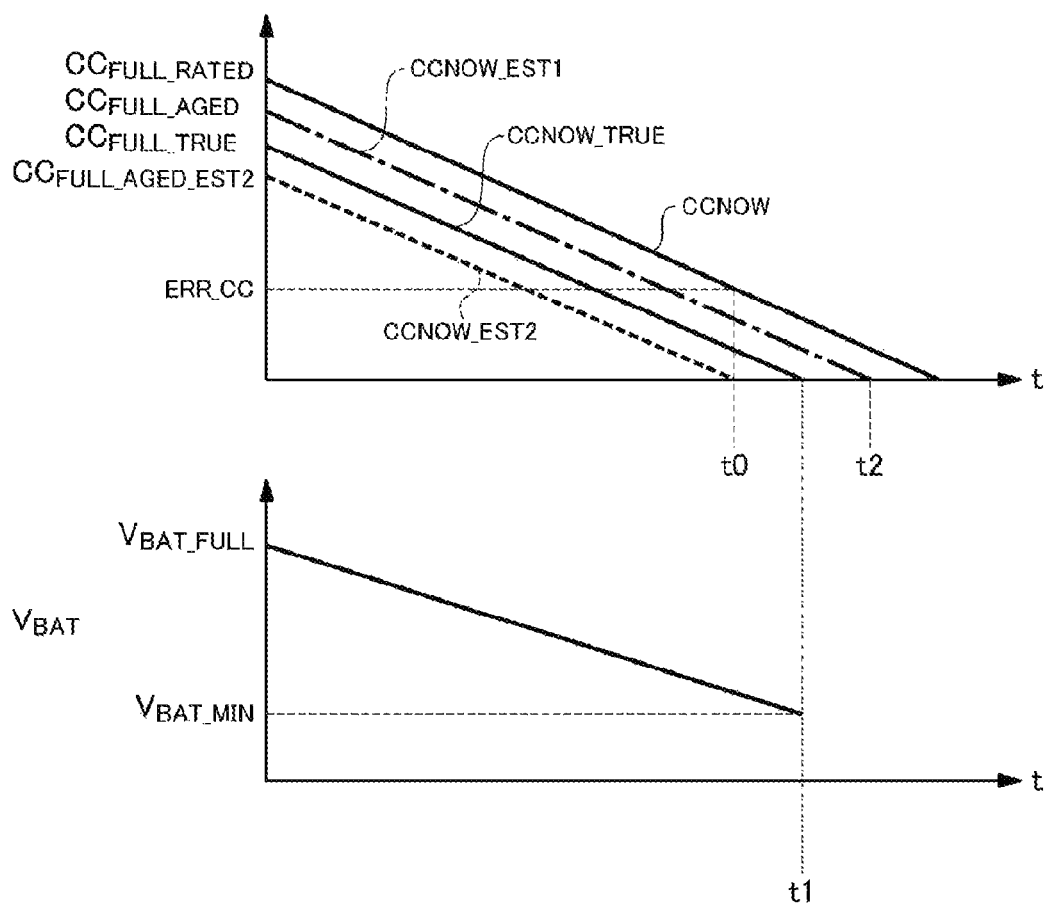
FIG. 18 is an operation waveform chart of a battery management system according to a ninth embodiment.
Figure 19:
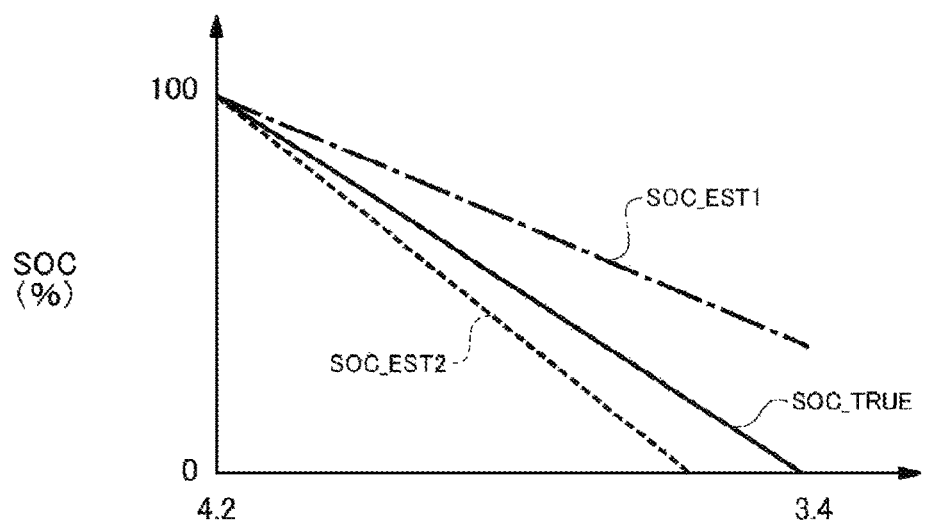
FIG. 19 is a view showing a relationship between a battery voltage $V_{BAT}$ and SOC in the ninth embodiment.

FIG. 18 is an operation waveform chart of the battery management system of the ninth embodiment. FIG. 19 is a view showing a relationship between the battery voltage $V_{BAT}$ and SOC. A solid line represents the correct SOC.

When the degraded battery capacity $CC_{FULL\_AGED}$ is smaller than the correct value, the battery voltage $V_{BAT}$ is decreased to the minimum operating voltage $V_{BAT\_MIN}$ at time t1 previous to time t2 at which SOC_EST1 (or CCNOW_EST1) calculated in the eighth embodiment becomes zero.

SOC_EST2 calculated in the ninth embodiment is estimated to be more degraded than SOC_EST1 with intention. This SOC_EST2 becomes zero at time t0 before time t1 and the value of CCNOW at that time may be obtained as ERR_CC.

Thus, according to the ninth embodiment, even when the degraded battery capacity $CC_{FULL\_AGED}$ is estimated to be smaller than the correct value, it is possible to approach a value thereof to the correct value.

(Tenth Embodiment)

A tenth embodiment is to revise the ninth embodiment.

The degradation calculation part 704 calculates a degraded battery capacity $CC_{FULL\_AGED\_EST3}$ in the following equation (2c) instead of equation (2b).

$$CC_{FULL\_AGED\_EST3} = CC_{FULL\_RATE} \times M - \text{CYC}_{CD} \times \alpha \times N \quad (2c)$$

Where, N>1 and 0<M<1.

In addition, the degradation calculation part 704 calculates CCNOW_EST3 and SOC_EST3 according to the following equations (7c) and (8c), respectively.

$$\text{CCNOW\_EST3} = \text{CCNOW} - (CC_{FULL\_RATED} - CC_{FULL\_AGED\_EST3}) = CC_{FULL\_AGED\_EST3} - \text{ACC} \quad (7c)$$

$$\text{SOC\_EST3} = \text{CCNOW\_EST3}/CC_{FULL\_AGED\_EST3} \times 100 = (CC_{FULL\_AGED\_EST3} - \text{ACC})/CC_{FULL\_AGED\_EST3} \times 100 \quad (8c)$$

The degradation calculation part 704 takes a value of CCNOW, which is obtained when the SOC_EST3 calculated in equation (8c) becomes zero, that is, when CCNOW_EST3 is zero, as ERR_CC. The degradation calculation part 704 uses ERR_CC to correct the degradation coefficient α. The correction may be made using equation (9) or a different function f.

Subsequently, the operation of the tenth embodiment will be described.

Figure 20:
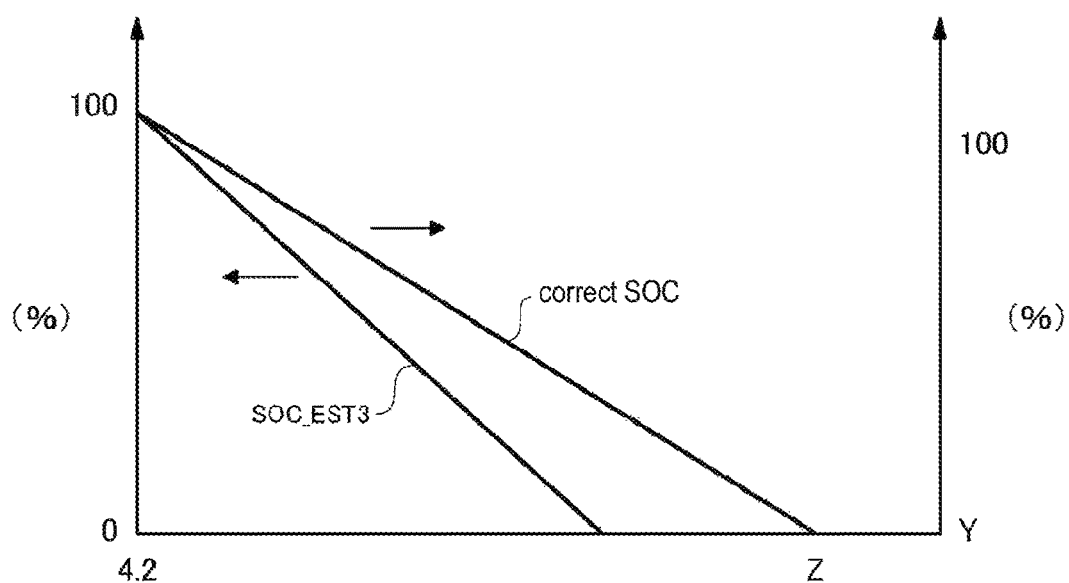
FIG. 20 is a view showing a relationship between a battery voltage $V_{BAT}$ and SOC in a tenth embodiment.

When M is expressed as (100−Y)/100, equation (2c) is equivalent to that Y % of the battery capacity is regarded as 0%. FIG. 20 is a view showing a relationship between the battery voltage $V_{BAT}$ and SOC in the tenth embodiment. A solid line represents the correct SOC. Z denotes a battery voltage $V_{BAT}$ obtained when SOC becomes Y %. Z may be measured in advance. Alternatively, a difference ΔV between an OCV voltage, which is obtained when SOC is 0%, and $V_{BAT\_MIN}$ may be obtained from a SOC-OCV table and may be subtracted from the open voltage OCV[Y %] when SOC is Y %.

$$Z = \text{OCV}[Y\%] - \Delta V$$

According to the tenth embodiment, it is possible to more correctly estimate the degraded battery capacity $CC_{FULL\_AGED}$.

The present disclosure describes some embodiments as above. The disclosed embodiments are exemplary, and thus, it should be understood by those skilled in the art that various modifications to combinations of the elements or processes above may be made and such modifications will also fall within the scope of the present disclosure. Some exemplary modifications will be described below.

(Modification 1)

Although the average temperature Tave of each cycle is used in the first to third embodiments, the minimum temperature Tmin or the maximum temperature Tmax may be reflected in the variation ΔX (or the correction coefficient ε).

(Modification 2)

In the above embodiments, the degradation cycle number X is calculated and the battery capacity $CC_{FULL}$ is calculated according to equation (2) based on the calculated degradation cycle number X. However, a battery capacity C may be directly calculated, as an index indicating degradation, according to the following equation (12) without calculating the degradation cycle number X.

$$CC_{FULL}[i+1] = CC_{FULL}[i] - \Delta C[i] \quad (12)$$

Where, ΔCM=X[i]×α

That is, at least one of temperature, SOC and cycle time $t_{CYC}$ may be reflected in the variation ΔC.

(Modification 3)

In the above embodiments, ΔX (or ΔC) has no temperature dependency when Tave<Tr. However, the present disclosure is not limited thereto. For example, the temperature Tave may be divided into a plurality of temperature ranges and at least one of M, Tr and ΔT may be taken as a different value for each of the temperature ranges. As one example, the temperature Tave may be divided into two temperature ranges with Tr as a boundary and the following relationship may be provided.

$$M = M1 \text{ and } \Delta T = \Delta T1 \text{ for } T > Tr$$

$$M = M2 \text{ and } \Delta T = \Delta T2 \text{ for } T < Tr$$

Alternatively, a different calculation equation may be used for each of the plurality of temperature ranges.

(Modification 4)

In the first to fourth embodiments, the average temperature Tave may be calculated for each of a charging cycle and a discharging cycle.

(Modification 5)

In the above embodiments, the "battery is charged/discharged with predetermined amount of charges" has been illustrated with the charging/discharging cycle. However, the present disclosure is not limited thereto. For example, the "battery is charged/discharged with predetermined amount of charges" may be a charging cycle (discharging cycle). Therefore, the index X (e.g., a degradation cycle number or battery capacity) may be updated every time the charging cycle (discharging cycle) is detected. Alternatively, the "battery is charged/discharged with predetermined amount of charges" may be a charging cycle or a discharging cycle. Therefore, the index X may be updated every time one of the charging cycle and the discharging cycle is detected.

In this case, the average temperature Tave (the maximum temperature, the minimum temperature or the like) may be calculated in each of the charging cycle and the discharging cycle and a range of SOC may be determined. In addition, charging cycle time and discharging cycle time may be individually measured and may be reflected in the variation ΔX.

In addition, in the above embodiments, the predetermined amount of charges is equivalent to the battery capacity. However, the present disclosure is not limited thereto. The predetermined amount of charges may be optionally determined. For example, the predetermined amount of charges may be equivalent to ½ of the battery capacity.

(Applications)

Figure 21:
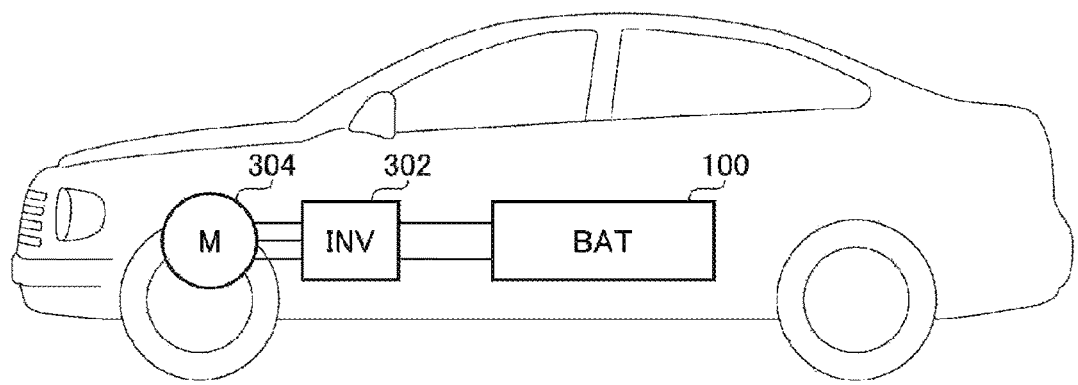
FIG. 21 is a view illustrating a vehicle including a battery management system.

Finally, applications of the battery management system 100 will be described. FIG. 21 is a view illustrating a vehicle 300 including the battery management system 100. The vehicle 300 may be, e.g., an electric vehicle (EV), a plug-in hybrid vehicle (PHV), a hybrid vehicle 9HV), etc. An inverter 302 receives a voltage $V_{BAT}$ from the battery management system 100, converts the voltage $V_{BAT}$ into an AC voltage, supplies the AC voltage to a motor 304, and rotates the motor 304 with the AC voltage. In deceleration such as when a brake is stepped on, the inverter 302 performs a regeneration operation to collect a current generated by the motor 304 into the battery 102 of the battery management system 100. The PHV and EV further include a charging circuit to charge the battery 102 of the battery management system 100.

Figure 22:
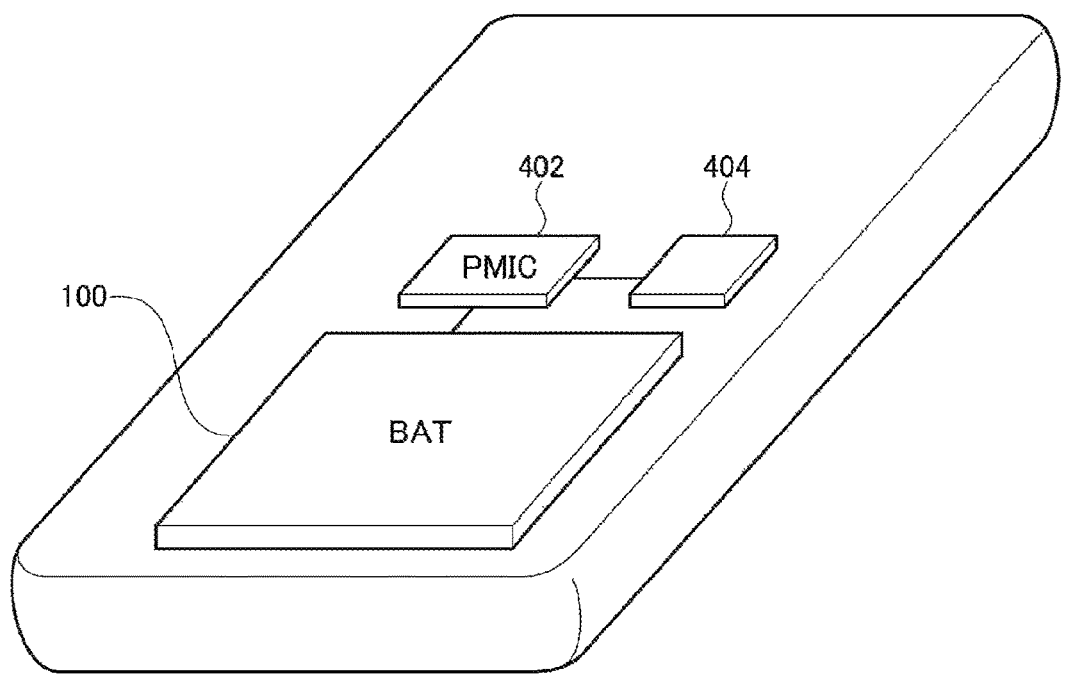
FIG. 22 is a view illustrating an electronic apparatus including a battery management system.

FIG. 22 is a view illustrating an electronic apparatus 400 including the battery management system 100. The electronic apparatus 400 includes a PMIC (Power Management IC) 402, a processor 404 and other electronic circuits (not shown), in addition to the battery management system 100. The PMIC 402 is a plurality of integrated power supply circuits and supplies appropriate power supply voltages to the processor 404 and other electronic circuits.

In addition, the battery management system 100 may be applied to power supplies of industrial equipment, industrial machines, storage systems for home/factory, elevator systems, etc.

According to the present disclosure in some embodiments, it is possible to improve the accuracy of estimation of degradation of a battery.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for estimating degradation of a rechargeable battery, comprising:
   determining a coulomb count value by integrating a charging/discharging current of the battery;
   monitoring a state of the battery;
   detecting that the battery is charged/discharged with a predetermined amount of charges, based on the coulomb count value;
   upon detecting charging/discharging of the battery with the predetermined amount of charges, detecting a variation ΔX in accordance with the state of the battery, which is measured in a period during which the battery is charged/discharged with the predetermined amount of charges;
   changing a degradation index X for the battery based on the detected variation ΔX; and
   determining a degradation degree of the battery based on the changed degradation index X,
   wherein the state of the battery includes at least a temperature of the battery, and
   wherein the variation ΔX is defined in accordance with one temperature T of an average temperature, a maximum temperature, and a minimum temperature in the period during which the battery is charged/discharged with the predetermined amount of charges.

2. The method of claim 1, wherein the variation ΔX is defined in accordance with the following equation under a condition in which the temperature T>Tr:

$$\Delta X = K \times M^{(T-Tr)/\Delta T}$$

where, K, M, Tr, and ΔT are parameters.

3. The method of claim 2, wherein 20 degrees C.≤Tr≤30 degrees C., 1<M<3, and 5 degrees C.≤ΔT≤20 degrees C.

4. The method of claim 2, wherein the variation ΔX is defined in accordance with the following equation under a condition in which the temperature T<Tr:

$$\Delta X = K.$$

5. The method of claim 1, wherein the state of the battery further includes a state of charge (SOC) of the battery, and wherein the variation ΔX depends on the SOC.

6. The method of claim 2, wherein the state of the battery further includes a state of charge (SOC) of the battery, and wherein the parameter K depends on the SOC.

7. The method of claim 1, further comprising measuring a time t required for the charging/discharging of the battery with the predetermined amount of charges,
   wherein the variation ΔX depends on the time t.

8. The method of claim 2, further comprising measuring a time t required for the charging/discharging of the battery with the predetermined amount of charges,
   wherein the parameter K depends on the time t.

9. The method of claim 1, wherein the charging/discharging of the battery with the predetermined amount of charges corresponds to one charging/discharging cycle, and
   wherein the degradation index X indicates a charging/discharging cycle number.

10. The method of claim 1, wherein the degradation index X indicates a battery capacity.

11. A degradation estimation circuit of a rechargeable battery, comprising:
    a cycle detection part configured to detect that the battery is charged/discharged with a predetermined amount of charges, based on a coulomb count value determined by integrating a charging/discharging current of the battery;

a state monitoring circuit configured to monitor a state of the battery; and a degradation calculation part configured to:
upon detecting charging/discharging of the battery with the predetermined amount of charges, detect a variation $\Delta X$ in accordance with the state of the battery, which is measured in a period during which the battery is charged/discharged with the predetermined amount of charges;
change a degradation index X for the battery based on the detected variation $\Delta X$; and
determine a degradation degree of the battery based on the changed degradation index X,
wherein the state of the battery includes at least a temperature of the battery, and
wherein the variation $\Delta X$ is defined in accordance with one temperature T of an average temperature, a maximum temperature, and a minimum temperature in the period during which the battery is charged/discharged with the predetermined amount of charges.

12. The degradation estimation circuit of claim 11, wherein the variation $\Delta X$ is defined in accordance with the following equation under a condition in which the temperature T>Tr:

$$\Delta X = K \times M^{(T-Tr)/\Delta T}$$

where, K, M, Tr, and $\Delta T$ are parameters.

13. The degradation estimation circuit of claim 12, wherein 20 degrees C.$\leq$Tr$\leq$30 degrees C., 1<M<3, and 5 degrees C.$\leq\Delta T\leq$20 degrees C.

14. The degradation estimation circuit of claim 12, wherein the variation $\Delta X$ is defined in accordance with the following equation under a condition in which the temperature T<Tr:

$$\Delta X = K.$$

15. The degradation estimation circuit of claim 11, wherein the state of the battery further includes a state of charge (SOC) of the battery, and
wherein the variation $\Delta X$ depends on the SOC.

16. The degradation estimation circuit of claim 12, wherein the state of the battery further includes a state of charge (SOC) of the battery, and
wherein the parameter K depends on the SOC.

17. The degradation estimation circuit of claim 11, further comprising a cycle time measurement part configured to measure a cycle time t required for the charging/discharging of the battery with the predetermined amount of charges,
wherein the variation $\Delta X$ depends on the cycle time t.

18. The degradation estimation circuit of claim 12, further comprising a cycle time measurement part configured to measure a cycle time t required for the charging/discharging of the battery with the predetermined amount of charges,
wherein the parameter K depends on the cycle time t.

19. The degradation estimation circuit of claim 11, wherein the charging/discharging of the battery with the predetermined amount of charges corresponds to one charging/discharging cycle, and
wherein the degradation index X indicates a charging/discharging cycle number.

20. The degradation estimation circuit of claim 11, wherein the degradation index X indicates a battery capacity.

21. An electronic apparatus comprising:
a rechargeable battery; and
the degradation estimation circuit of claim 11, which is configured to detect the state of the battery.

22. A vehicle comprising:
a rechargeable battery; and
the degradation estimation circuit of claim 11, which is configured to detect the state of the battery.

23. A method for estimating degradation of a rechargeable battery, comprising:
determining a detection value in accordance with a charging/discharging current of the battery;
detecting at least one among a temperature of the battery, a state of charge (SOC) of the battery, and a charging/discharging cycle time of the battery;
determining a correction coefficient based on the detected at least one among the temperature of the battery, the state of charge (SOC) of the battery, and the charging/discharging cycle time of the battery;
determining an increment of a coulomb count value by multiplying the detection value by the correction coefficient;
changing the coulomb count value by adding the increment to the coulomb count value; and
determining a degradation degree of the battery based on the changed coulomb count value.

24. A degradation estimation circuit of a rechargeable battery, comprising:
a correction coulomb counter circuit configured to determine a correction coulomb count value;
a temperature detection circuit configured to detect a temperature T of the battery;
a state of charge calculation part configured to detect a state of charge (SOC) of the battery;
a cycle time measurement part configured to detect a cycle time $t_{CYC}$ required for each charging/discharging cycle of the battery;
a cycle detection part configured to detect that the battery is charged/discharged with a predetermined amount of charges, based on the correction coulomb count value; and
a degradation calculation part configured to:
upon detecting charging/discharging of the battery with the predetermined amount of charges, change a degradation index X for the battery by a predetermined value, and
determine a degradation degree of the battery based on the changed degradation index X,
wherein the correction coulomb counter circuit is configured to correct a variation of the correction coulomb count value based on at least one selected from a group consisting of the detected temperature T, the detected state of charge (SOC), and the detected cycle time $t_{CYC}$.

25. A method for estimating degradation of a rechargeable battery, comprising:
detecting charging/discharging of the battery with a predetermined amount of charges;
upon detecting charging/discharging of the battery with the predetermined amount of charges, determining a coulomb count value by integrating a charging/discharging current of the battery;
incrementing a charging/discharging cycle number $CYC_{CD}$ based on the detected coulomb count value;
calculating, as a degradation degree of the battery, a degraded battery capacity $CC_{FULL\_AGED}$ using a degradation coefficient $\alpha$ according to the following equation:

$$CC_{FULL\_AGED} = CC_{FULL\_RATED} - \alpha \times CYC_{CD}$$

where, $CC_{FULL\_RATED}$ is a rated capacity of the battery; and correcting the degradation coefficient α using the calculated degraded battery capacity $CC_{FULL\_AGED}$ such that the degradation degree of the battery after a subsequent charging/discharging cycle of the battery is calculated using the corrected degradation coefficient α.

26. The method of claim 25, wherein the act of correcting the degradation coefficient α includes:

calculating a current residual coulomb count value CCNOW not indicative of battery degradation according to the following equation:

$$CCNOW = CC_{FULL\_RATED} - ACC;$$

calculating a current residual coulomb count value CCNOW_EST1 indicative of the battery degradation according to the following equation:

$$CCNOW\_EST1 = CCNOW - (CC_{FULL\_RATED} - CC_{FULL\_AGED}) = CC_{FULL\_AGED} - ACC;$$

taking the current residual coulomb count value CCNOW obtained when the residual coulomb count value CCNOW_EST1 or a value of SOC_EST1 becomes zero, as ERR_CC according to the following equation:

$$SOC\_EST1 = CCNOW\_EST1/CC_{FULL\_AGED} \times 100 = (CC_{FULL\_AGED} - ACC)/CC_{FULL\_AGED} \times 100;\text{ and}$$

updating the degradation coefficient α based on the ERR_CC.

27. The method of claim 25, wherein the act of correcting the degradation coefficient α includes:

calculating a current residual coulomb count value CCNOW not indicative of battery degradation according to the following equation:

$$CCNOW = CC_{FULL\_RATED} - ACC;$$

calculating a degraded battery capacity for estimation $CC_{FULL\_AGED\_EST2}$ according to the following equation:

$$CC_{FULL\_AGED\_EST2} = CC_{FULL\_RATED} - CYC_{CD} \times \alpha \times N$$

where, N is an integer larger than 1;

calculating a current residual coulomb count value CCNOW_EST2 indicative of the battery degradation according to the following equation:

$$CCNOW\_EST2 = CCNOW - (CC_{FULL\_RATED} - CC_{FULL\_AGED\_EST2}) = CC_{FULL\_AGED\_EST2} - ACC;$$

taking the current residual coulomb count value CCNOW obtained when the residual coulomb count value CCNOW_EST2 or a value of SOC_EST2 becomes zero, as ERR_CC according to the following equation:

$$SOC\_EST2 = CCNOW\_EST2/CC_{FULL\_AGED\_EST2} \times 100 = (CC_{FULL\_AGED\_EST2} - ACC)/CC_{FULL\_AGED\_EST2} \times 100;\text{ and}$$

updating the degradation coefficient α based on the ERR_CC.

28. The method of claim 25, wherein the act of correcting the degradation coefficient α includes:

calculating a current residual coulomb count value CCNOW not indicative of battery degradation according to the following equation:

$$CCNOW = CC_{FULL\_RATED} - ACC;$$

calculating a degraded battery capacity for estimation $CC_{FULL\_AGED\_EST3}$ according to the following equation:

$$CC_{FULL\_AGED\_EST3} = CC_{FULL\_RATED} \times M - CYC_{CD} \times \alpha \times N$$

where, N>1 and 0<M<1;

calculating a current residual coulomb count value CCNOW_EST3 indicative of the battery degradation according to the following equation:

$$CCNOW\_EST3 = CCNOW - (CC_{FULL\_RATED} - CC_{FULL\_AGED\_EST3}) = CC_{FULL\_AGED\_EST3} - ACC;$$

taking the current residual coulomb count value CCNOW obtained when the residual coulomb count value CCNOW_EST3 or a value of SOC_EST3 becomes zero, as ERR_CC according to the following equation:

$$SOC\_EST3 = CCNOW\_EST3/CC_{FULL\_AGED\_EST3} \times 100 = (CC_{FULL\_AGED\_EST3} - ACC)/CC_{FULL\_AGED\_EST3} \times 100;\text{ and}$$

updating the degradation coefficient α based on the ERR_CC.

29. The method of claim 26, wherein the act of updating the degradation coefficient α includes calculating an updated degradation coefficient α' according to the following equation:

$$\alpha' = (\alpha + ERR\_CC)/CYCCD.$$

* * * * *